(12) United States Patent
Raberg et al.

(10) Patent No.: US 8,063,633 B2
(45) Date of Patent: Nov. 22, 2011

(54) MAGNETORESISTIVE MAGNETIC FIELD SENSOR STRUCTURE

(75) Inventors: Wolfgang Raberg, Sauerlach (DE); Juergen Zimmer, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 587 days.

(21) Appl. No.: 12/171,185

(22) Filed: Jul. 10, 2008

(65) Prior Publication Data

US 2009/0015252 A1    Jan. 15, 2009

(30) Foreign Application Priority Data

Jul. 13, 2007   (DE) .......................... 10 2007 032 867

(51) Int. Cl.
*G01R 33/09*    (2006.01)
*H01L 43/08*    (2006.01)

(52) U.S. Cl. ..................................... 324/252

(58) Field of Classification Search ............. 324/207.21, 324/252; 338/32 R; 360/324, 324.1, 324.11, 360/324.12
See application file for complete search history.

(56) References Cited

U.S. PATENT DOCUMENTS

| 5,701,222 | A | 12/1997 | Gill et al. | |
|---|---|---|---|---|
| 5,751,521 | A * | 5/1998 | Gill | 360/314 |
| 6,204,071 | B1 | 3/2001 | Ju et al. | |
| 6,771,472 | B1 * | 8/2004 | Mao et al. | 360/314 |
| 6,801,411 | B1 | 10/2004 | Lederman et al. | |
| 6,988,414 | B2 | 1/2006 | Rührig et al. | |
| 7,116,530 | B2 | 10/2006 | Gill | |
| 7,177,122 | B2 * | 2/2007 | Hou et al. | 360/324.12 |
| 7,697,242 | B2 * | 4/2010 | Gill | 360/314 |
| 2001/0028537 | A1 * | 10/2001 | Gill | 360/314 |
| 2002/0075611 | A1 * | 6/2002 | Seigler et al. | 360/324 |
| 2007/0216406 | A1 * | 9/2007 | Witcraft et al. | 324/252 |

FOREIGN PATENT DOCUMENTS

| DE | 44 27 495 A1 | 2/1996 |
|---|---|---|
| DE | 103 19 319 A1 | 1/2005 |
| WO | WO 00/79297 A1 | 12/2000 |

* cited by examiner

*Primary Examiner* — Kenneth J Whittington
(74) *Attorney, Agent, or Firm* — Slater & Matsil, L.L.P.

(57) ABSTRACT

A magnetic field sensor structure including a first magnetoresistive element in a spin-valve arrangement with a first reference layer structure with a first reference magnetization direction and a second magnetoresistive element in a spin-valve arrangement with a second reference layer structure with a second reference magnetization direction, wherein the first and second magnetoresistive elements are arranged in a layer vertically above each other and galvanically isolated from each other by an intermediate layer, and wherein the first and second reference magnetization directions are different.

32 Claims, 16 Drawing Sheets

MAGNETORESISTIVE MAGNETIC FIELD SENSOR STRUCTURE

This application claims priority to German Patent Application 10 2007 032 867.4, which was filed Jul. 13, 2007 and is incorporated herein by reference.

TECHNICAL FIELD

The present invention relates to a magnetoresistive magnetic field sensor structure on the basis of spin-valve structures, and to methods of manufacturing the same.

BACKGROUND

Detecting small magnetic fields by means of large magnetoresistance changes while using up as little chip surface area as possible and with a low level of manufacturing-process complexity is becoming increasingly important for applications in automotive and industrial electronics. In this context, it is particularly important to achieve compatibility and optimization of parameter swing, or signal swing (change in the magnetoresistance as a function of a change in the magnetic field), chip surface area, manufacturing-process complexity, current consumption, etc.

In sensor technology, currently GMR structures (GMR=giant magnetoresistance) or TMR structures (TMR=tunneling magnetoresistance) are frequently used. GMR and TMR structures will be summarized below using the term xMR structures. In electric contacting of such xMR structures or xMR layer systems, one differentiates between a CIP configuration (CIP=current in plane) and a CPP configuration (CPP=current perpendicular to plane). In the CIP configuration, an xMR layer system is contacted from one side, and a current flow follows such that it is essentially parallel or lateral to the layer system, whereas in the CPP configuration, an xMR layer system is contacted from two sides, so that a current flow may occur such that is essentially perpendicular to the xMR layer system. GMR layer systems are commonly operated in the CIP configuration, which is associated with a relatively small amount of effort in terms of process engineering on account of contacting from one side at a layer package or at a layer structure. On the other hand, TMR layer systems are often operated in the CPP configuration, which may use contacting the layer package or layer system from two sides. However, there are also TMR layer systems which may be operated in a CIP configuration, which shall be referred to as a CIPT configuration (i.e., a CIP configuration with a TMR layer system). Contacting the layer system from one side only (above or below) allows a simpler manufacturing process as compared to contacting from both sides, as is the case in the CPP configuration.

Spin-valve magnetic sensors based on GMR or TMR technology have advantages over Hall and AMR technologies (AMR=anisotropic magnetoresistance), as are established today, in particular with respect to their measuring sensitivities. On account of their reference magnetization, useful for operation, GMR and/or TMR elements (xMR elements) are suited to sense both magnetic field directions and field strengths. In an implementation as a linear field sensor, xMR elements may be employed, for example, for detecting rotational speeds of pole wheels and/or of toothed wheels influencing a magnetic field (bias magnetic field) (so-called speed sensors). To this end, xMR spin-valve sensors may be spaced apart at a distance of about half a pole distance or tooth distance of a transmitter wheel and may be connected to form a Wheatstone bridge or half-bridge. Thus, a differential output signal may be obtained by means of a differential magnetic field by spatially separating Wheatstone bridges.

SUMMARY OF THE INVENTION

In accordance with embodiments, the present invention provides a magnetic field sensor structure comprising a first magnetoresistive element in a spin-valve arrangement with a first reference layer structure with a first reference magnetization direction and a second magnetoresistive element in a spin-valve arrangement with a second reference layer structure with a second reference magnetization direction, wherein the first and second magnetoresistive elements are arranged in a layer stack vertically above each other and galvanically isolated from each other by an intermediate layer, and wherein the first and second reference magnetization directions are different.

In accordance with further embodiments, the present invention provides a magnetic field detection device comprising a first magnetoresistive element in a spin-valve arrangement with a first reference layer structure with a first reference magnetization direction, and a second magnetoresistive element in a spin-valve arrangement with a second reference layer structure with a second reference magnetization direction, wherein the first and second magnetoresistive elements are arranged in a layer stack vertically above each other and galvanically isolated from each other by an intermediate layer, and wherein the first and second reference magnetization directions are opposed to each other, and wherein the two magnetoresistive elements are connected in a bridge circuit such that, due to an inverse change in the resistance values of the two magnetoresistive elements, a difference signal is detectable proportionally to the magnetic field and/or a magnetic field change between two bridge arms of the bridge circuit.

Still further embodiments provide a method of producing a magnetic field sensor structure, comprising a step of arranging a first magnetoresistive element in a spin-valve arrangement with a first reference layer structure with a layer thickness DRL,1 and a first ferromagnetic layer structure with a layer thickness DPL,1, and a step of arranging a second magnetoresistive element, vertically above the first magnetoresistive element and galvanically isolated therefrom, in a spin-valve arrangement with a second reference layer structure with a layer thickness DRL,2 and a second ferromagnetic layer structure with a layer thickness DPL,2, wherein a first layer thickness ratio of the layer thickness DPL,1 to the layer thickness DRL,1 is greater than 1, and a second layer thickness ratio of the layer thickness DPL,2 to the layer thickness DRL,2 is smaller than 1, and a step of exposing the first magnetoresistive element and the second magnetoresistive element to a magnetization field with an advantageous magnetization direction during a magnetization write-in process in order to obtain different reference magnetization directions in the first and second reference layer structures.

Further embodiments of the present invention provide a method of producing a magnetic field sensor structure, comprising a step of arranging a first magnetoresistive element in a spin-valve arrangement with a first reference layer structure with a layer thickness DRL,1 and a first ferromagnetic layer structure with a layer thickness DPL,1, and a step of arranging a second magnetoresistive element, vertically above the first magnetoresistive element and galvanically isolated therefrom, in a spin-valve arrangement with a second reference layer structure, wherein a first layer thickness ratio of the layer thickness DPL,1 to the layer thickness DRL,1 is greater than 1, and a step of exposing the first magnetoresistive element and the second magnetoresistive element to a magnetization field with an advantageous magnetization direction during a magnetization write-in process in order to obtain different reference magnetization directions in the first and second reference layer structures.

Still further embodiments of the present invention provide a method of producing a magnetic field sensor structure, comprising a step of arranging a first magnetoresistive element in a spin-valve arrangement with an odd number of ferromagnetic layer structures which may be antiferromagnetically coupled to one other, a step of arranging a second magnetoresistive element, vertically above the first magnetoresistive element and galvanically isolated therefrom, in a spin-valve arrangement with an even number of ferromagnetic layer structures which may be antiferromagnetically coupled to one other, and a step of exposing the first magnetoresistive element and the second magnetoresistive element to a magnetization field with an advantageous magnetization direction during a magnetization write-in process in order to obtain a first ferromagnetic reference layer structure of the first magnetoresistive element and a second ferromagnetic reference layer structure of the second magnetoresistive element, which comprise different reference magnetization directions.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

Figure 1A:
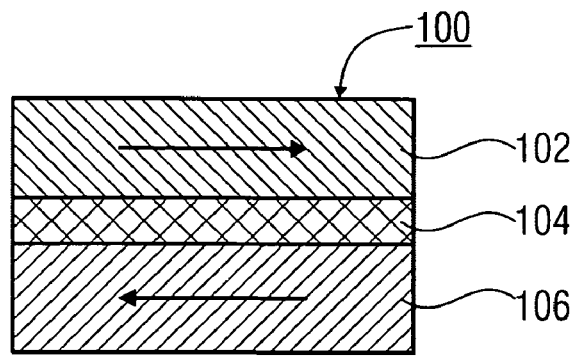
FIGS. 1A to 1C show schematic representations of a fundamental architecture of different types of GMR sensor elements, and the associated schematic representation of the magnetic field dependence of the magnetization and of the resistance value of the magnetoresistive structure.

With respect to the subsequent description it should be noted that in the various embodiments functional elements which are identical or have identical actions will be designated by identical reference numerals, and that the descriptions of these functional elements are mutually interchangeable in the various embodiments represented below.

Indications of directions such as "right-hand", "left-hand", "top", "bottom" included in explanations of the accompanying figures relate to the respective planes of projection. Indications such as "vertical", "horizontal" or "lateral" shall refer to a magnetic field-sensitive component or chip surface in the following.

Before giving a detailed description of embodiments of the present invention with reference to FIGS. 3 to 13, xMR structures will be briefly addressed in general below with reference to FIGS. 1 to 2. The term xMR structure is understood to mean GMR structures and TMR structures in the description which follows. In particular, they shall be understood to mean GMR and TMR layer structures in a so-called spin-valve arrangement.

Figure 1B:
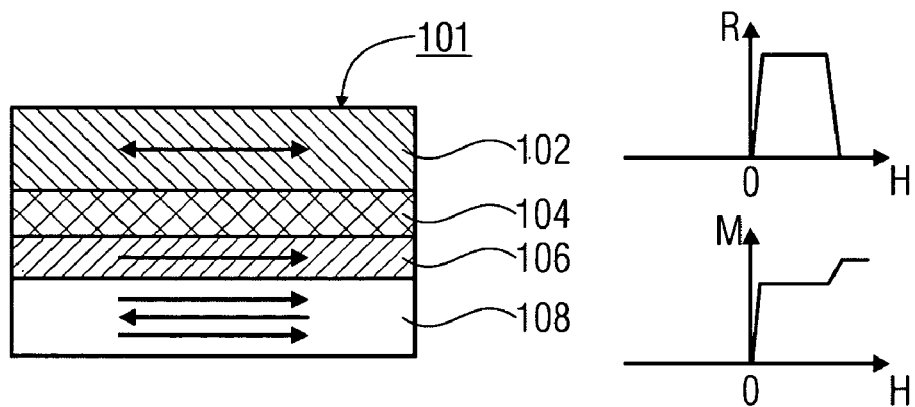
Figure 1C:
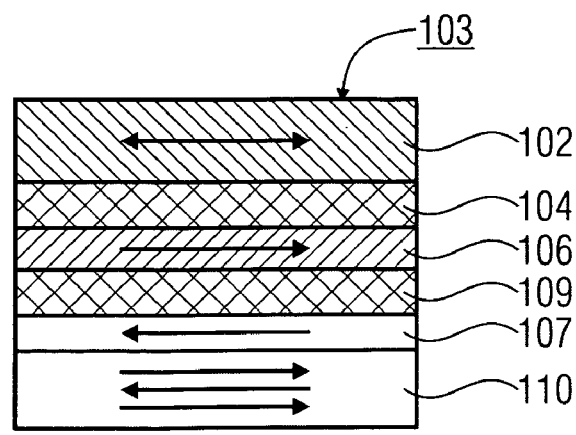

GMR structures will initially be briefly addressed below in general. GMR structures are frequently operated in a CIP configuration, i.e., a voltage applied causes a current in parallel with the sheet structure. In practice, for example, for utilization in automotive technology, particularly large temperature ranges, for example, from −40° C. to +150° C., and small field strengths of a few kA/m may be used for optimum and reliable operation. Several different implementations of GMR structures are depicted in FIGS. 1A to 1C.

Figure 2A:
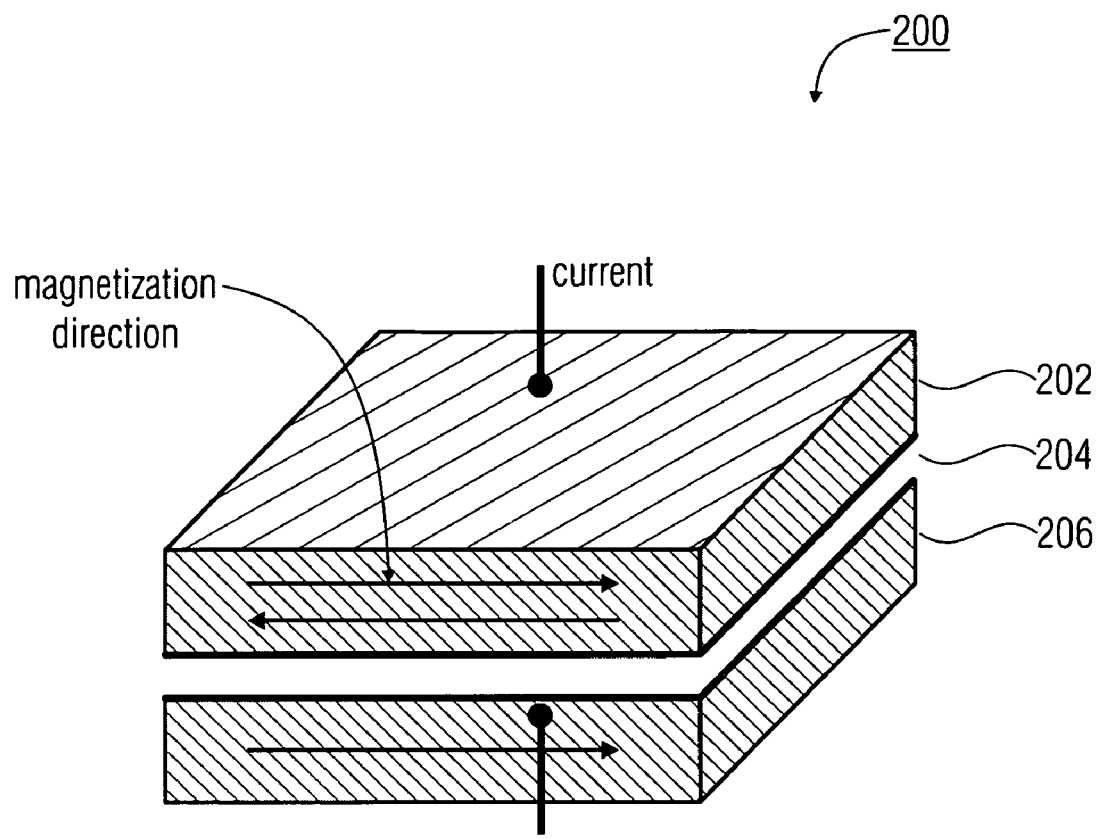
FIG. 2A shows a schematic architecture of a TMR layer structure in a CPP configuration.

The GMR structure depicted in FIG. 2A shows the case of a coupled GMR system 100, wherein two magnetic layers 102, 106, e.g., of cobalt (Co), are isolated by a non-magnetic layer 104, e.g., of copper (Cu).

The thickness of the non-magnetic layer 104 is selected such that without an external magnetic field being applied, an antiferromagnetic coupling of the soft magnetic layers 102, 106 will result. This is to be illustrated by the arrows shown.

An external field will then change the anti-parallel alignment of the magnetization of the soft magnetic layers 102, 106, as a result of which the electric resistance value of the GMR structure 100 will also change.

The GMR structure depicted in FIG. 1B shows a spin-valve arrangement 101, wherein the non-magnetic layer 104 is selected to be sufficiently thick so that no more magnetic coupling of the soft magnetic layers 102, 106 will occur. The bottom magnetic layer structure 106 is strongly coupled to an antiferromagnetic layer 108, so that it will be magnetically hard (comparable to a permanent magnet). Therefore, the layer structure 106 may be regarded as a reference layer structure having a reference magnetization direction.

The upper magnetic layer structure 102 is soft magnetic and serves as a measuring layer. It may be re-magnetized even by a relatively small external magnetic field M, as a result of which the angle between the magnetic layer structure 102 and the reference layer structure 106 will change. This results in a change in the electric resistance value R.

The spin-valve arrangement 101 depicted in FIG. 1B will be addressed below in more detail. Such a spin-valve arrangement 101 consists of a ferromagnetic layer structure 102 which is isolated (magnetically decoupled) from a second ferromagnetic layer structure 106 by a non-magnetic layer 104, whereas its magnetization direction, however, is retained because it is coupled to an antiferromagnetic layer 108 by means of the so-called "exchange-bias interaction" (exchange bias=exchange anisotropy). As a coupling phenomenon between ferromagnetic and antiferromagnetic layers, the exchange-bias effect is of decisive importance for the realization of sensitive, spin valve-type magnetic field sensors. While for ferromagnetic materials the hysteresis loop is located to be symmetrical to the zero point of an external field, an antiferromagnet/ferromagnet layer system has a hysteresis loop which is displaced from the zero point and wherein only one stable magnetization direction is still present. Rotating the magnetization out of this stable direction may consume more energy than rotating in the original direction. This difference in energy is referred to as exchange anisotropy. In spin valves, an antiferromagnetic layer ensures that the magnetization of the ferromagnetic adjacent layer 106 is retained (pinning). Therefore, the ferromagnetic adjacent layer structure 106 is also referred to as a pinned layer.

The fundamental mode of operation of a spin-valve structure may be illustrated using the magnetization and R(M) curves in FIG. 1B. The reference magnetization direction of the ferromagnetic reference layer structure 106 or of the pinned layer is retained in a negative direction. If the external magnetic field M is increased from negative to positive values, the "free", ferromagnetic layer 102 will switch over in the vicinity of the zero crossing (H=0), and the resistance value R will rise sharply. The resistance value R will then remain high for as long as the external magnetic field M is sufficiently large to overcome the exchange coupling between the ferromagnetic pinned layer 106 and the antiferromagnetic layer 108, and to also align the pinned layer 106 in parallel with the external magnetic field. Thereafter, the resistance will go down again.

The GMR structure 103 depicted in FIG. 1C differs from the GMR structure 101 shown in FIG. 1B in that, here, the bottom antiferromagnetic layer 108 is replaced by a combination of a natural antiferromagnet 110 and a synthetic antiferromagnet 106, 107, 109 (SAF) located above it, which is composed of a ferromagnetic reference layer structure 106, a further ferromagnetic layer structure 107, and an intermediate non-magnetic layer structure 109. The magnetization direction of the ferromagnetic layer structure 107 is retained by being coupled to the natural antiferromagnet 110 by means of the exchange-bias interaction. The ferromagnetic reference layer structure 106 is antiferromagnetically coupled to the pinned ferromagnetic layer structure 107 by the so-called RKKY interaction (Rudermann, Kittel, Kasuya and Yosida). In this manner, the reference magnetization direction of the ferromagnetic reference layer 106 is retained. The upper ferromagnetic layer structure 102 in turn serves as a measuring layer, the magnetization direction of which may readily be rotated by means of an external magnetic field.

An advantage of utilizing the combination of natural and synthetic antiferromagnets as compared to the architecture of FIG. 1B is increased field and temperature stability.

So-called TMR structures will generally be addressed below with reference to FIGS. 2A and 2B. The range of application of TMR structures is very similar to that of GMR structures. FIG. 2A shows a typical TMR structure 200.

It shall be emphasized at this point that TMR structures generally are complex multi-sheet layer systems. For clarity's sake, this complex multi-sheet layer system is limited to three main layers 202, 204, 206.

The TMR structure 200 shown in FIG. 2A is operated in a CPP configuration. The tunnel magnetoresistance TMR is obtained in tunnel contacts wherein two ferromagnetic electrodes 202, 206 are decoupled by a thin, electrically insulating tunnel barrier 204. Electrons may tunnel through this thin barrier 204 between the two electrodes 202, 206. The tunneling magnetoresistance is based on the fact that the tunneling current depends on the relative orientation of the magnetization direction in the ferromagnetic electrodes 202, 206.

Figure 2B:
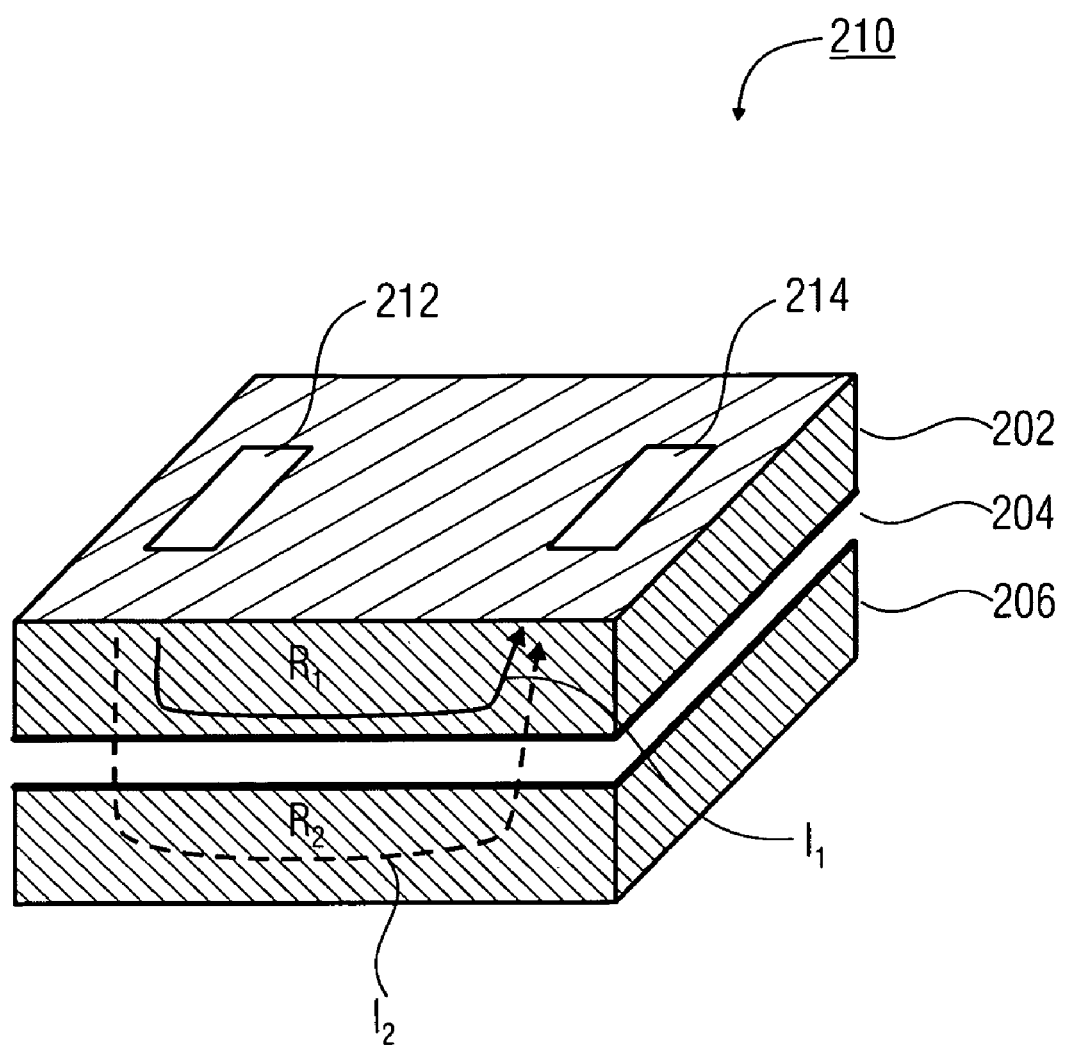
FIG. 2B shows a schematic architecture of a TMR layer stack in a CIPT configuration.

FIG. 2B shows a TMR layer structure 210 operated in a CIPT configuration (i.e. a CIP configuration in a TMR layer system). For this purpose, two electric terminals or electrodes 212, 214 are located on a surface of the layer structure 210. If an electric field is applied to the TMR layer structure 210 via the electrodes 212, 214, a more or less strong flow of current will result from the electrode 212 to the electrode 214 (or vice versa), depending on the magnetization directions of the magnetic layers 202, 206. The first magnetic layer structure 202 comprises a resistance $R_1$ per unit area, the barrier layer 204 comprises a barrier resistance $R_{12}$, and the second magnetic layer structure 206 comprises a resistance $R_2$ per unit area. The resistance values $R_1$, $R_{12}$ and $R_2$ of the three layers are each mean electric layer resistances and determine how a current or a current path between the first contact area 212 and the second contact area 214 divides up into a current $I_1$ along the first magnetic layer structure 202 and a current $I_2$ along the second magnetic layer structure 206. The resistances are dependent on the TMR effect of the TMR layer system, or on the contact distance of the first and second contact areas 212, 214. It is in particular the resistance $R_{12}$ that is dependent on the TMR effect.

The above-described magnetoresistive structures thus have an electric characteristic dependent on an external magnetic field which is present, i.e., the resistivity of an xMR structure is influenced by an external magnetic field which acts upon it.

Now that the properties of GMR and TMR layer structures which are useful for understanding embodiments of the present invention have been described, embodiments of the present invention will be explained in more detail below.

Figure 3:
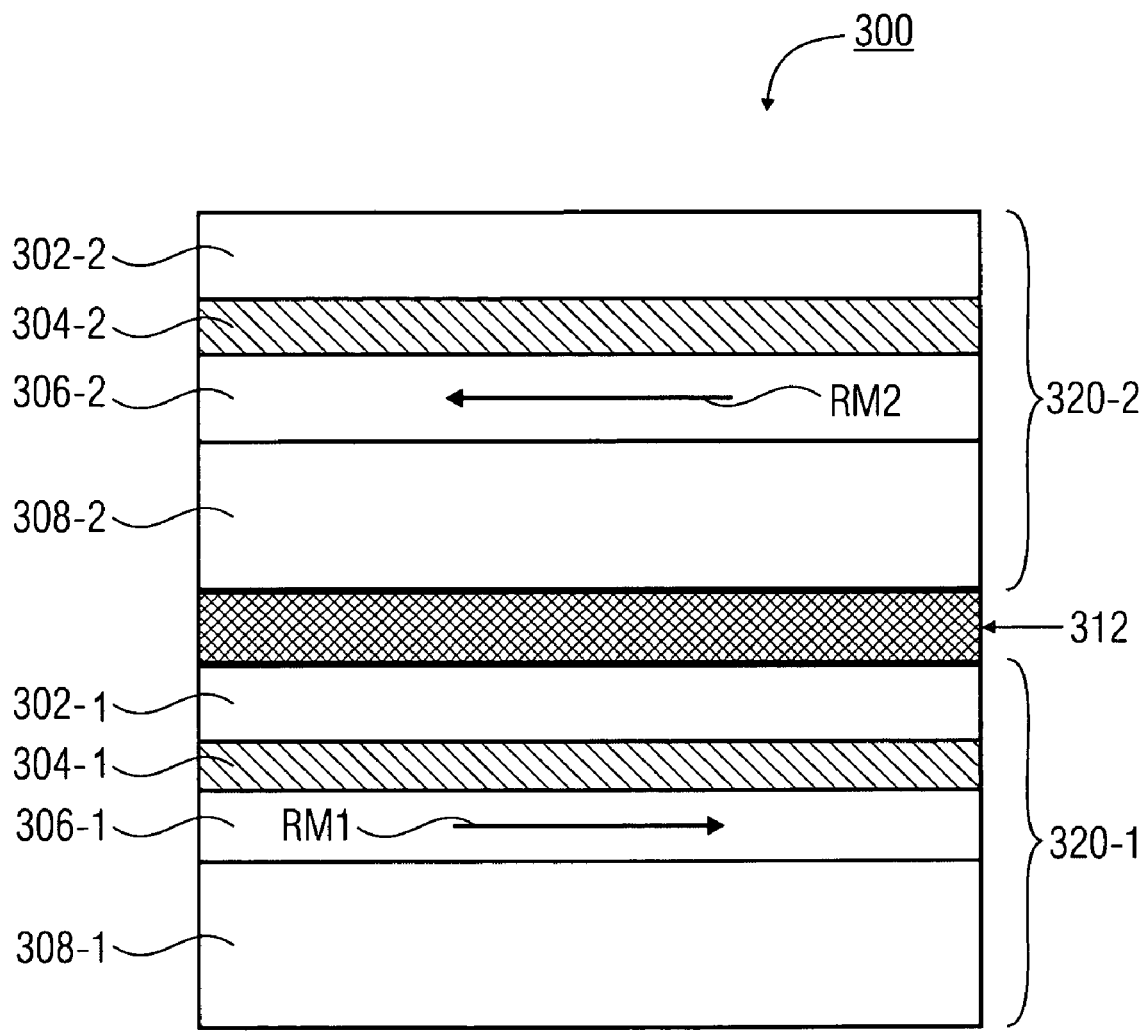
FIG. 3 shows a schematic cross-sectional view of a magnetic field sensor structure in accordance with embodiments of the present invention.

FIG. 3 shows a magnetic field sensor structure 300 in accordance with an embodiment of the present invention.

The magnetic field sensor structure 300 comprises a first magnetoresistive element 320-1 in a spin-valve arrangement with a first reference layer structure 306-1 with a first reference magnetization direction RM1, and a second magnetoresistive element 320-2 in a spin-valve arrangement with a reference layer structure 306-2 with a second reference magnetization direction RM2. The first magnetoresistive element 320-1 and the second magnetoresistive element 320-2 are arranged in a layer stack vertically above each other and galvanically isolated from each other by an intermediate layer 312. The first reference magnetization direction RM1 and the second reference magnetization direction RM2 are different, in particular opposed to each other.

The layer structures 308-1 and 308-2 may be antiferromagnetic layer structures. In embodiments, the layer structures 308-1 and/or 308-2 may comprise a natural antiferromagnet and, in addition, ferro- and non-magnetic layer structures which are arranged above it and form a synthetic antiferromagnet with the reference layer structures 306-1 or 306-2, as was already described with reference to FIG. 1C. The ferromagnetic layers 302-1 and 302-2 are isolated from the respective ferromagnetic reference layer structures 306-1 and 306-2 by barrier layers 304-1 or 304-2, for example, non-magnetic layers.

In accordance with embodiments, the magnetic field sensor structure 300 is implemented as an integrated component which may be manufactured, for example, in the context of a CMOS process.

In embodiments, the first 320-1 and/or the second 320-2 magnetoresistive element(s) is/are implemented as GMR spin-valve elements (GMR=giant magnetoresistance).

In further embodiments, the first 320-1 and/or the second 320-2 magnetoresistive element(s) is/are implemented as TMR spin-valve elements (TMR=tunneling magnetoresistance).

By a magnetic field sensor structure in accordance with embodiments of the present invention which comprise different, in particular, mutually opposed reference magnetization directions RM1, RM2, a differential measuring principle is enabled in one and the same location since the two magnetoresistive xMR sensor elements 320-1 and 320-2 are arranged vertically above each other. The term opposed is to mean that the reference magnetization directions RM1 and RM2 form an angle within a range of 180°±30° and, in particular, at about 180°. With this "double-decker" principle, highly precise magnetic field measurements (which are free from magnetic bridge offsets) may be performed. Additionally, as compared to manufacturing conventional xMR sensors, a magnetic field sensor structure in accordance with embodiments may be manufactured or processed with only a small amount of overhead time, as will be explained in more detail later on in a description of a manufacturing process.

A specific magnetic field sensor structure in accordance with embodiments of the present invention will be explained in detail below with reference to FIG. 4.

Figure 4:
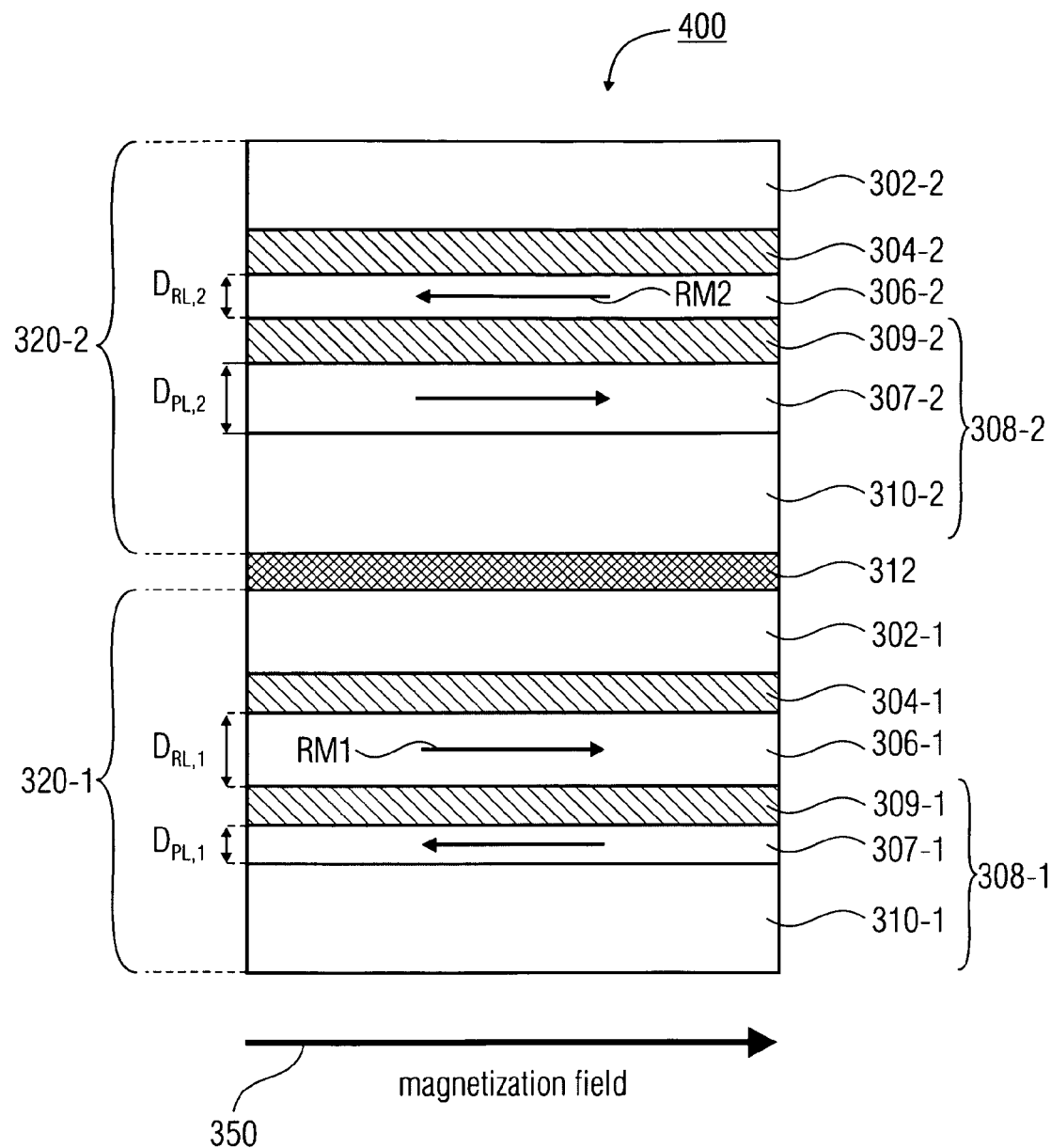
FIG. 4 shows a schematic cross-sectional view of a magnetic field sensor structure in accordance with further embodiments of the present invention.

The magnetic field sensor structure 400 shown in FIG. 4 comprises a first magnetoresistive element 320-1 in a spin-valve arrangement, and a second magnetoresistive element 320-2 in a spin-valve arrangement. The layer structures 308-1 and 308-2 shown in FIG. 3 are each replaced, in the embodiment shown in FIG. 4, by an arrangement comprised of a natural antiferromagnet 310-1 or 310-2, a ferromagnetic layer 307-1 or 307-2, and a non-magnetic layer 309-1 or 309-2, respectively. The arrangements consisting of the reference layer structures 306-1 or 306-2, of the non-magnetic layer structures 309-1 or 309-2, and of the ferromagnetic layer structure 307-1 or 307-2 (pinned layers) each form a synthetic antiferromagnet. The ferromagnetic layer structures or the pinned layers 307-1 or 307-2 are each antiferromagnetically coupled to the reference layer structures 306-1 and 306-2, respectively, on account of the RKKY interaction.

The first reference layer structure 306-1 comprises a layer thickness $D_{RL,1}$, and the first ferromagnetic layer structure 307-1 comprises a layer thickness $D_{PL,1}$. The second reference layer structure 306-2 comprises a layer thickness $D_{RL,2}$, and the second ferromagnetic layer structure 307-2 comprises a layer thickness $D_{PL,2}$.

The spin-valve arrangements 320-1, 320-2 shown in FIG. 4 are each so-called "bottom-pinned" spin-valve arrangements, wherein a natural antiferromagnet 310-n (n=1, 2) has a synthetic antiferromagnet deposited thereon which consists of a pinned layer structure 307-n (n=1, 2), a non-magnetic layer 309-n (n=1, 2), and the ferromagnetic reference layer structure 306-n (n=1, 2). After a further non-magnetic layer 304-n (n=1, 2), the respective sensor layer 302-n (n=1, 2) is arranged or deposited thereon.

In the embodiment shown in FIG. 4, a first layer thickness ratio $D_{PL,1}/D_{RL,1}$ of the layer thickness $D_{PL,1}$ of the first ferromagnetic layer structure 307-1 to the layer thickness $D_{RL,1}$ of the first reference layer structure 306-1 is smaller than 1, and a second layer thickness ratio $D_{PL,2}/D_{RL,2}$ of the layer thickness $D_{PL,2}$ of the second ferromagnetic layer structure 307-2 to the layer thickness $D_{RL,2}$ of the second reference layer structure 306-2 is greater than 1, i.e., $D_{PL,1}/D_{RL,1}<1$ and $D_{PL,2}/D_{RL,2}>1$. In particular, in embodiments, the first layer thickness ratio $D_{PL,1}/D_{RL,1}$ may be inverse to the second layer thickness ratio $D_{PL,2}/D_{RL,2}$, i.e. $D_{PL,1}/D_{RL,1}=D_{RL,2}/D_{PL,2}$. Naturally, in other embodiments, the first layer thickness ratio $D_{PL,1}/D_{RL,1}$ may be greater than 1, and the second layer thickness ratio $D_{PL,2}/D_{RL,2}$ may be smaller than 1, i.e., $D_{PL,1}/D_{RL,1}>1$ and $D_{PL,2}/D_{RL,2}<1$.

In the embodiment shown in FIG. 4, the first layer thickness ratio $D_{PL,1}/D_{RL,1}$ is smaller than 1, i.e., the ferromagnetic reference layer structure 306-1 has a larger thickness $D_{RL,1}$ than the first ferromagnetic layer structure 307-1. Accordingly, in the embodiment shown in FIG. 4, the second ferromagnetic reference layer structure 306-2 has a smaller thickness $D_{RL,2}$ than the second ferromagnetic layer structure 307-2.

The different reference magnetization directions RM1 and RM2 may be specified, in a manufacturing process in accordance with embodiments of the present invention, by applying a magnetization field 350 with precisely one advantageous magnetization direction. In accordance with the invention, specific layer thickness ratios $D_{PL,n}/D_{RL,n}$ (n=1, 2) of layer thicknesses of the reference layer structures 306-n (n=1, 2) and layer thicknesses of the ferromagnetic layer structures 307-n (n=1, 2) are to be selected, as well as specific magnetization field strengths as a function of the layer thicknesses or layer thickness ratios, as will be explained in more detail below.

A method of manufacturing the magnetic field sensor structure 400 comprises arranging the first magnetoresistive element 320-1 in a spin-valve arrangement with the first reference layer structure 306-1 with a layer thickness $D_{RL,1}$ and a first ferromagnetic layer structure 307-1 with a layer thickness $D_{PL,1}$, and arranging a second magnetoresistive element 320-2, vertically above the first magnetoresistive element and galvanically isolated therefrom by the layer 312, in a spin-valve arrangement with a second reference layer structure 306-2 with a layer thickness $D_{RL,2}$ and a second ferromagnetic layer structure 307-2 with a layer thickness $D_{PL,2}$, wherein the first layer thickness ratio $D_{PL,1}/D_{RL,1}$ of the layer thickness $D_{PL,1}$ to the layer thickness $D_{RL,1}$ is greater than 1, and the second layer thickness ratio $D_{PL,2}/D_{RL,2}$ of the layer thickness $D_{PL,2}$ to the layer thickness $D_{RL,2}$ is smaller than 1, and exposing the first magnetoresistive element 320-1 and the second magnetoresistive element 320-2 to a magnetization field 350 with an advantageous magnetization direction during a magnetization write-in process, in order to obtain different, in particular opposed, reference magnetization directions RM1 and RM2 in the first 306-1 and second 306-2 reference layer structures.

The two individual spin-valve sensors 320-1 and 320-2 are arranged on a substrate such that they are located above each other and are galvanically isolated from each other by the isolating barrier 312, for example, by means of a deposition process. The two magnetoresistive elements 320-1 and 320-2 differ only with regard to their reference systems consisting of the layer 307-n (n=1, 2), which is pinned in each case, and of the corresponding ferromagnetic reference layer 306-n (n=1, 2). Together with the non-magnetic layer 309-n (n=1, 2), respectively, both layers form a synthetic antiferromagnet in each case, the net magnetic moment of which is determined, with uneven layer thicknesses $D_{PL,n}$ and $D_{RL,n}$ (n=1, 2), by the "thicker one" of the two layers 307-$n$ (n=1, 2), 306-$n$ (n=1, 2).

In an inventive magnetization process with a magnetization field 350, the thicker layer, respectively, of the layers 307-$n$ (n=1, 2), 306-$n$ (n=1, 2) is rotated in the direction of the magnetization field 350, the thinner layer, respectively, follows the thicker layer in an anti-parallel manner because of its antiferromagnetic coupling caused by the RKKY interaction.

The magnetization direction between the free layer 302-$n$ (n=1, 2) and the reference layer 306-$n$ (n=1, 2) is decisive for the xMR effect. In a magnetization process with a magnetization field direction, reference magnetization directions RM1, RM2 of the reference layer structures 306-$n$ (n=1, 2) may be adjusted to be either parallel or anti-parallel to a lateral magnetic field to be detected, depending on the layer thickness ratio $D_{RL,n}/D_{PL,n}$ (n=1, 2). Thus, in embodiments it is possible to locally generate, in a homogenous magnetization field 350, anti-parallel reference magnetization directions RM1, RM2 of the two reference layer structures 306-$n$ (n=1, 2) in both individual sensors 320-1 and 320-2 by means of a single magnetization process of, e.g., an entire wafer.

In embodiments, the two individual sensors 320-1 and 320-2 may be electrically connected, in each case, via electric contacts, for example, from the bottom (the bottom sensor 320-1 is triggered) or from the top (the top sensor 320-2 is triggered).

A possibility of a layout of a magnetic field sensor structure in accordance with embodiments of the present invention shall be explained in more detail below. A natural antiferromagnet 310-$n$ (n=1, 2) has a synthetic antiferromagnet (e.g., PtMn, IrMn) consisting of a ferromagnetic layer structure 307-$n$ (n=1, 2) (e.g. CoFe), a non-magnetic intermediate layer 309-$n$ (n=1, 2) (e.g., Ro), and a further ferromagnetic reference layer structure 306-$n$ (n=1, 2) (e.g., CoFe) arranged thereon, for example, by means of a deposition process. The ferromagnetic pinned layer structure 307-$n$ (n=1, 2) is coupled to the natural antiferromagnet 310-$n$ (n=1, 2) via the exchange-bias field, and it thus forms a reference magnetization for the respective magnetic field sensor structure 320-1 and/or 320-2. The ratio of the layer thicknesses of the first ferromagnetic layer structure 307-1 to the first reference layer structure 306-1 in this case is smaller than 1, for example. The synthetic antiferromagnet has a further non-magnetic layer 304-$n$ (n=1, 2) (e.g., Cu) arranged or deposited thereon, with a following further ferromagnetic layer 302-$n$ (n=1, 2) (e.g., CoFe, NiFe) serving as a sensor layer.

Examples of materials for a natural antiferromagnet 310-$n$ (n=1, 2) are PtMn, NiMn, FeMn, IrMn, IrMnCr, RhMn, PtRuMn, PtRhMn. For example, CoFe, NiFe, CoFeB, NiFeB, NiCoFe, Co, FeN and combinations in terms of the sheet sequence and composition, also with an N content, may serve as ferromagnetic materials for ferromagnetic layer structures 306-$n$ (n=1, 2), 307-$n$ (n=1, 2). Cu, Cr, Ru, Ir, Alox, MgO, AlN, for example, may be used for the non-magnetic intermediate layers 309-$n$ (n=1, 2).

After the first magnetoresistive element 320-1 has been deposited, a galvanically isolating barrier layer 312 is applied. For this purpose, aluminum oxide ($Al_2O_3$) or magnesium oxide (MgO) may be used, for example, which is used for TMR technology anyhow and is thus available in processing TMR structures in a deposition layer. Thus, the barrier layer 312 may be applied in situ without any interruption of a vacuum. The barrier layer 312 has a further magnetoresistive element 320-2 applied thereon, wherein the layer thickness ratio of the second ferromagnetic layer structure 307-2 to the ferromagnetic reference layer 306-2 is smaller than 1, for example. After depositing the second, top magnetoresistive element 320-2, a capping layer of, e.g., Ta or TaN is typically applied for passivation.

In the embodiment of the present invention shown in FIG. 4, the magnetoresistive elements 320-$n$ (n=1, 2) are so-called bottom-pinned spin-valve arrangements (BSV). A bottom-pinned spin-valve arrangement is characterized in that a natural antiferromagnet has a ferromagnetic layer structure 307-$n$ (n=1, 2) applied thereto as a pinned layer, etc. By contrast, with a top-pinned spin-valve arrangement (TSV) a layer sequence will be inverse to that represented in FIG. 4. This means that the ferromagnetic layer 307-$n$ (n=1, 2) will be located below the natural antiferromagnet 310-$n$ (n=1, 2). Of course, embodiments of the present invention also include magnetic field sensor structures comprising top-pinned spin-valve arrangements. Provision of a mixture of both types is also feasible.

If in the magnetization write-in process a magnetization field 350 is applied which, as is indicated in FIG. 4, points to the right, for example, a magnetization direction RM1 of the reference layer structure 306-1 which points to the right would result for the bottom magnetoresistive element 320-1 shown in FIG. 4, and a reference magnetization RM2 aligned to the left would result for the top magnetoresistive element 320-2.

In accordance with embodiments of the present invention, the magnetization field 350, or its field strength, is selected, with the magnetization direction desired, such that the antiferromagnetic coupling between the reference layer structure 306-$n$ (n=1, 2) and the ferromagnetic layer structure 307-$n$ (n=1, 2), which is due to the RKKY interaction, is not broken by the magnetization field 350. With a broken antiferromagnetic coupling, the magnetizations of the reference layer structures 306-$n$ (n=1, 2) and of the pinned ferromagnetic layer structures 307-$n$ (n=1, 2) would otherwise also comprise, for medium-sized (100 mT to 500 mT) magnetization fields 350, components which are perpendicular to the magnetization field 350, or would comprise, for very strong magnetization fields 350 (larger than 500 mT), the magnetizations of the reference layers 306-$n$ (n=1, 2) and of the pinned ferromagnetic layers 307-$n$ (n=1, 2) would be aligned in the direction of the magnetization field. In this case, there would no longer be any difference in terms of the magnetic alignment of the respective reference layer structure 306-$n$ (n=1, 2) for the first magnetoresistive element 320-1 and the second magnetoresistive element 320-2. In other words, this means that, during a magnetization write-in process, the first magnetoresistive element 320-1 and the second magnetoresistive element 320-2 should be exposed to a magnetization field which in accordance with the invention is not too large, and which comprises an advantageous magnetization direction. In order to obtain different (opposed) reference magnetization directions RM1 and RM2 in the first reference layer structure 306-1 and in the second reference layer structure 306-2, a field strength of the magnetization field 350 should be adjusted to a value of below 300 mT, in particular between 10 mT and 250 mT (mT=millitesla), depending on the layer thickness ratios $D_{RL,n}/D_{PL,n}$ (n=1, 2). A precise value for the magnetization field 350 depends on materials used, layer thicknesses, and the antiferromagnetic coupling (RKKY interaction) between the ferromagnetic layers 306-$n$ and 307-$n$ (n=1, 2).

Figure 5:
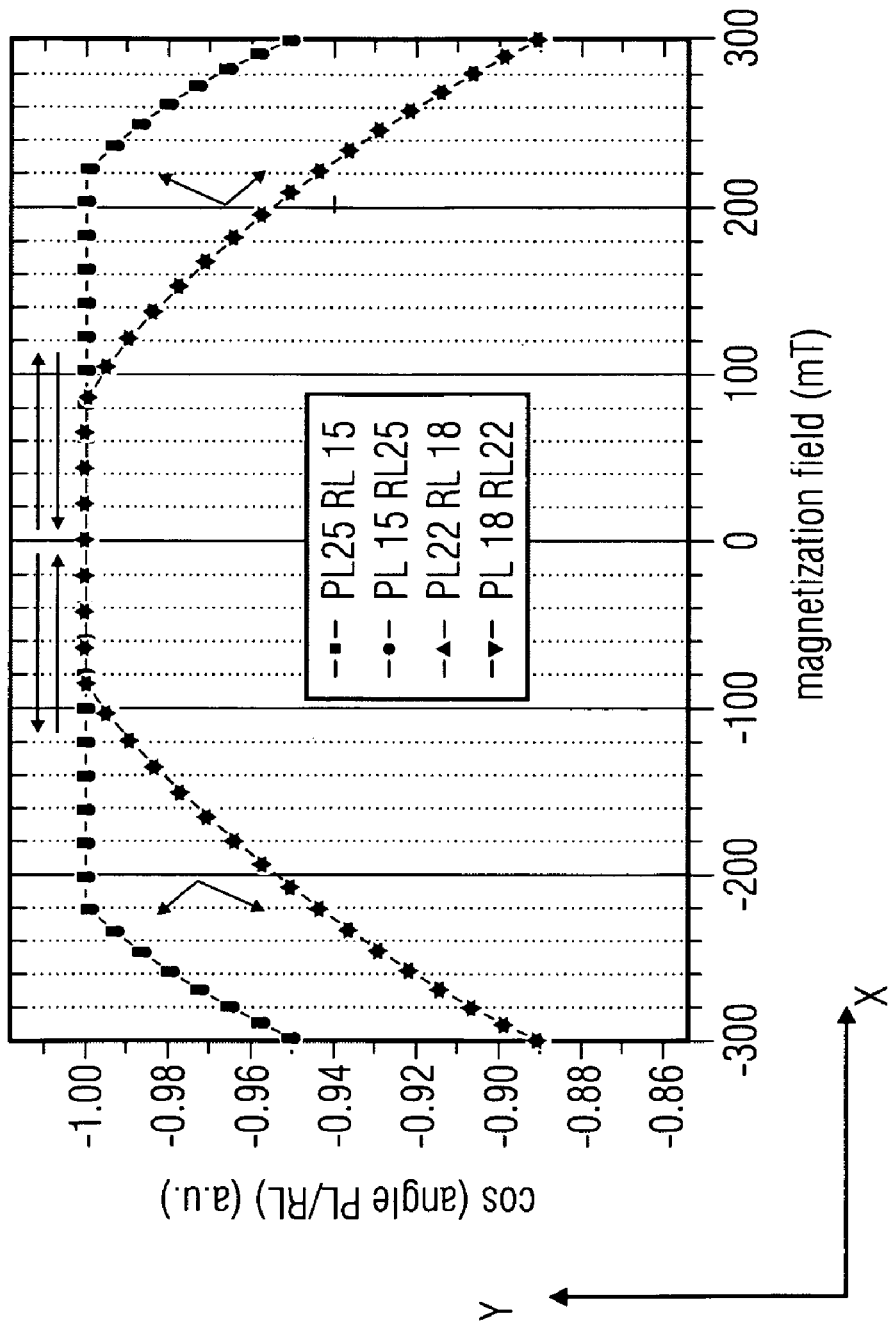
FIG. 5 shows a representation of an anti-parallel alignment of a reference layer and a pinned layer as a function of a magnetization field for a synthetic antiferromagnet with different layer thickness ratios in accordance with embodiments of the present invention.

FIG. 5 shows results of micromagnetic simulations with regard to an opposed or anti-parallel alignment of the reference magnetizations RM1 and RM2 of the reference layer structures 306-$n$ (n=1, 2) and the corresponding ferromagnetic layer structures 307-$n$ ($n=1$, 2) as a function of an applied magnetization field 350 during a magnetizing operation in accordance with embodiments of the present invention. The ferromagnetic layer structure 307-$n$ ($n=1$, 2) was regarded as "free" in this context. "Free" in this context means that, during a magnetization process at a high temperature, the ferromagnetic layer structure 307-$n$ ($n=1$, 2) is not pinned to the natural antiferromagnet 310-$n$ ($n=1$, 2) by the exchange-bias interaction.

The Y axis describes the cosine of an angle between the reference layer structure 306-$n$ ($n=1$, 2) and the corresponding pinned ferromagnetic layer structure 307-$n$ ($n=1$, 2). The value of $-1.0$ corresponds to an ideal anti-parallel alignment between the reference layer structure 306-$n$ ($n=1$, 2) and the corresponding pinned ferromagnetic layer structure 307-$n$ ($n=1$, 2). In the case of a layer thickness ratio $D_{PL,n}/D_{RL,n}$ ($n=1$, 2) of 22/18, in particular 22 Å/18 Å, i.e., for example, $D_{PL,n}$ ($n=1$, 2)=22 Å and $D_{RL,1,n}$ ($n=1$, 2)=18 Å, which is only slightly asymmetric, one will recognize that an anti-parallel alignment of the first and second reference magnetization directions, respectively, to the magnetization direction of the first and second pinned ferromagnetic layer structure 307-$n$ ($n=1$, 2), respectively, is retained up to a magnetization field strength of about 100 mT.

A further shift in the layer thickness ratio $D_{PL,n}/D_{RL,n}$ ($n=1$, 2) toward 25/15, in particular 25 Å/15 Å, i.e., for example, $D_{PL,n}$ ($n=1$, 2)=25 Å and $D_{RL,n}$ ($n=1$, 2)=15 Å, will extend the allowed magnetization field range to about ±250 mT.

In this context, it is irrelevant which of the two respective layers 306-$n$ ($n=1$, 2), 307-$n$ ($n=1$, 2) is the thicker one, i.e., whether $D_{PL,n}/D_{RL,n}$ ($n=1$, 2) is larger or smaller than 1.

In addition to a maximum magnetization field strength for a magnetization process of magnetic field sensor structures in accordance with embodiments of the present invention, there is also a minimum magnetization field strength which should be achieved in the magnetization process. In accordance with embodiments of the present invention, a magnetization field 350 has a field strength of at least 5 mT. It is advantageous to select a field strength of the magnetization field to be larger than 20 mT.

Figure 6:
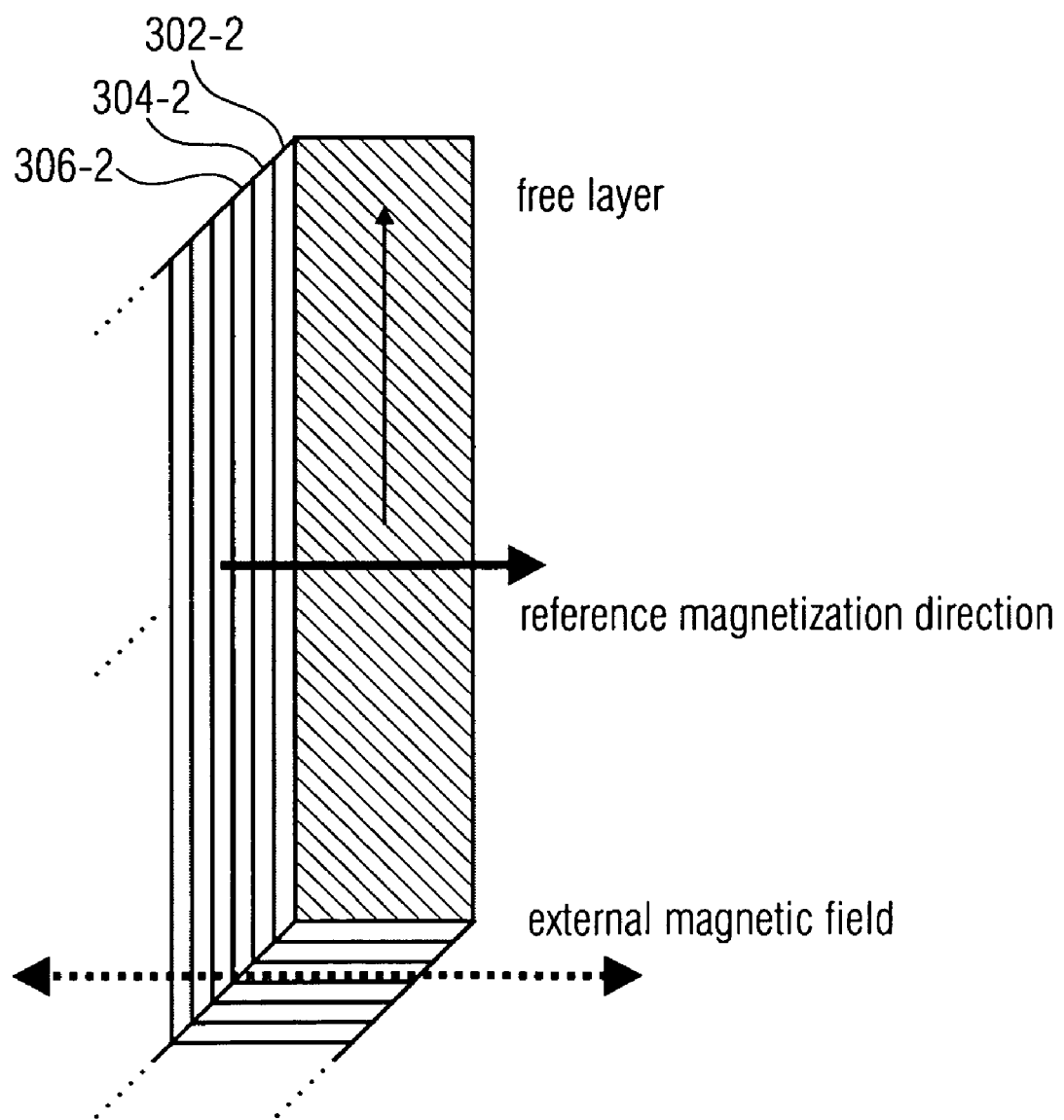
FIG. 6 shows a top view of a magnetic field sensor structure with a shape anisotropy in accordance with embodiments of the present invention.

Sensors on an xMR basis, in particular speed sensors, generally comprise magnetic anisotropy which is typically adjusted by a structural width by exploiting the so-called shape anisotropy, so that structural widths of typically 1 µm are employed. On this note, FIG. 6 shows a top view of a magnetic field sensor structure in accordance with an embodiment of the present invention.

A width and a slope of the resistance switching range, which eventually determine the range of a detectable magnetic field change, may be adjusted, for example, via impressed magnetic anisotropy axes. Anisotropy generally refers to a directional dependence of a property, here, in particular, to the directional dependence of the magnetization of the free layer 302-$n$ ($n=1$, 2). The so-called shape anisotropy, which is determined by a lateral geometric aspect ratio of the xMR magnetic field sensor structure 400, is suitable for this purpose, for example. For example, in an xMR structure, the length of which shall be considerably larger than its width, the magnetization advantageously remains in the direction of the longitudinal axis. This is a so-called easy access. Here, the magnetic anisotropy is therefore substantially determined by the shape of the sample. Accordingly, this is then called shape anisotropy. For reasons of minimizing the magnetostatic energy, it is favorable for the magnetization direction to align along the longitudinal axis of the xMR structure 400 by means of the shape anisotropy. The narrower the xMR structure, the stronger the effect. In a configuration of the xMR structure as is shown in FIG. 6, while taking into account the shape of anisotropy effects, a magnetization of the free layer 302-$n$ ($n=1$, 2) will therefore result which is perpendicular or approximately perpendicular to the reference magnetization direction of the respective reference layer structure 306-$n$ ($n=1$, 2), as is indicated in FIG. 6. Without an external magnetic field, each of the two spin-valve arrangements 320-$n$ ($n=1$, 2) therefore has a mean electric resistance. A positive or negative magnetic field along the reference magnetization axes results in that the magnetization of the free layer 302-1 or 302-2 is rotated out of its original position against the shape anisotropy until it is parallel or anti-parallel to the respective reference magnetization RM1 or RM2 of the respective reference layer 306-1 or 306-2. In this context, one of the two free layers is aligned to be parallel to its reference layer structure (resistance decreases), whereas the other free layer simultaneously is aligned to be anti-parallel to its reference layer structure (resistance increases).

Due to the shape anisotropy with strip structures, some kind of a restoring force results for the magnetization of the free layer. In this manner, it is possible to measure not only magnetization directions, but also magnetic field strengths. If, however, broad structures are used, no shape anisotropy will result, and thus no restoring force will result for the magnetization of the free layer. As a result, exact magnetic field direction measurement is possible without shape anisotropy.

For illustration, top views of local reference magnetizations of a reference layer structure 306-$n$ ($n=1$, 2) of a magnetic field sensor structure having a width of 1 µm in accordance with embodiments are shown, in FIGS. 7A to 7D, for various layer thickness ratios $D_{PL,n}/D_{RL,n}$ ($n=1$, 2) as result from micromagnetic simulations.

Figure 7A:
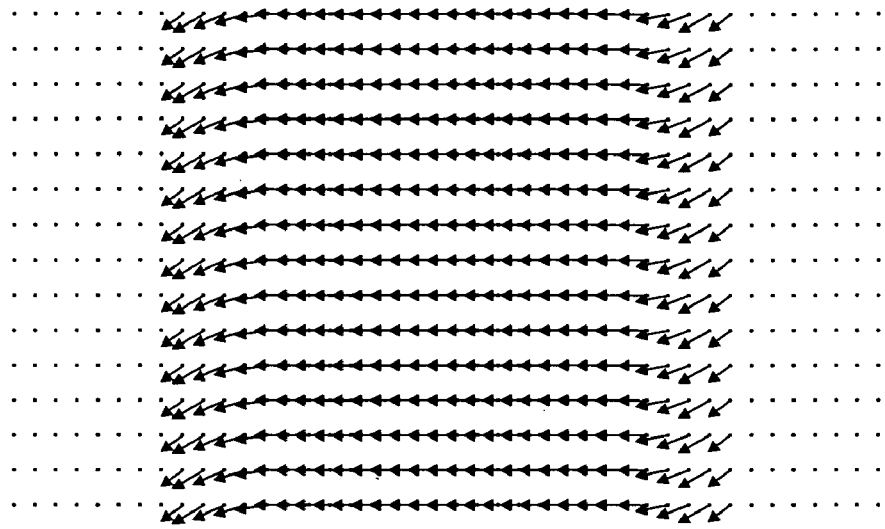
FIGS. 7A to 7D show top views of reference layer magnetizations of an xMR structure having a width of 1 μm with different layer thickness ratios and different magnetization field strengths in accordance with embodiments of the present invention.
Figure 7B:
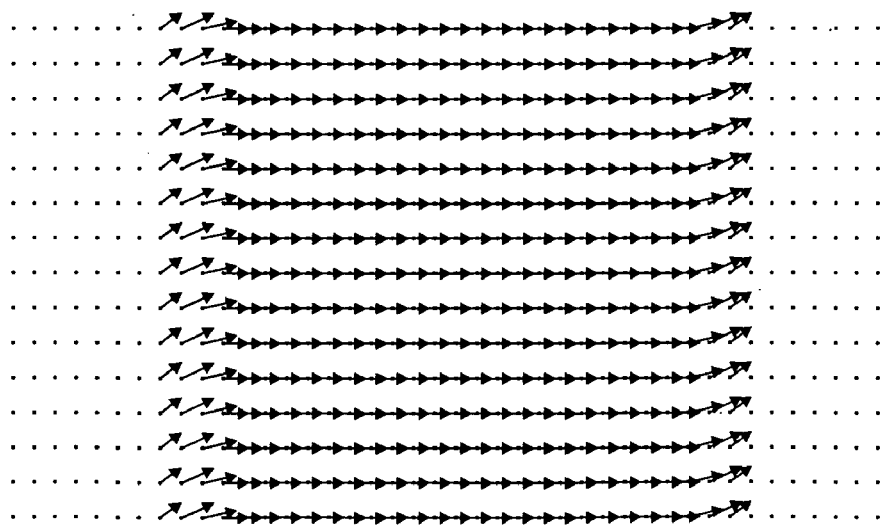

FIG. 7A shows a top view of the reference magnetization direction of a reference layer structure 306-$n$ ($n=1$, 2) of a strip having a width of 1 µm with a layer thickness ratio $D_{PL,n}/D_{RL,n}$=25/15 ($n=1$, 2) with a magnetization field strength of 40 mT to 80 mT. FIG. 7B shows a top view of the reference magnetization direction of a reference layer structure 306-$n$ ($n=1$, 2) of a strip having a width of 1 µm with a layer thickness ratio $D_{PL,n}/D_{RL,n}$=15/25 ($n=1$, 2) with a magnetization field strength of 40 mT to 80 mT.

With the layer thickness ratios shown in FIGS. 7A, 7B, even the edge magnetizations are already aligned roughly in the reference magnetization direction. Due to the large difference in the layer thicknesses of the reference layer structure 306-$n$ ($n=1$, 2) and the pinned ferromagnetic layer structure 307-$n$ ($n=1$, 2), the net magnetic moment is relatively high, which leads to a high level of alignability in a relatively large magnetic field range of the magnetization.

Figure 7C:
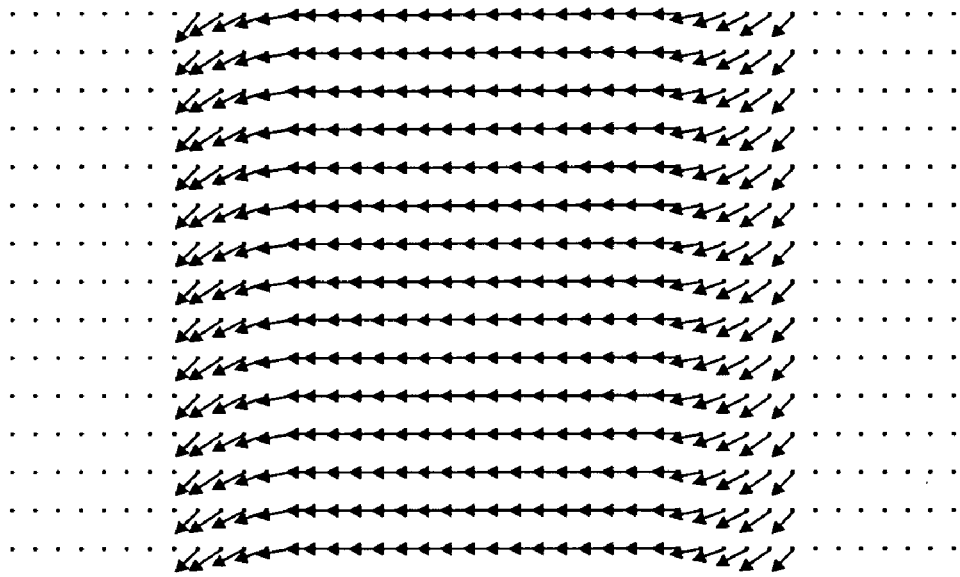
Figure 7D:
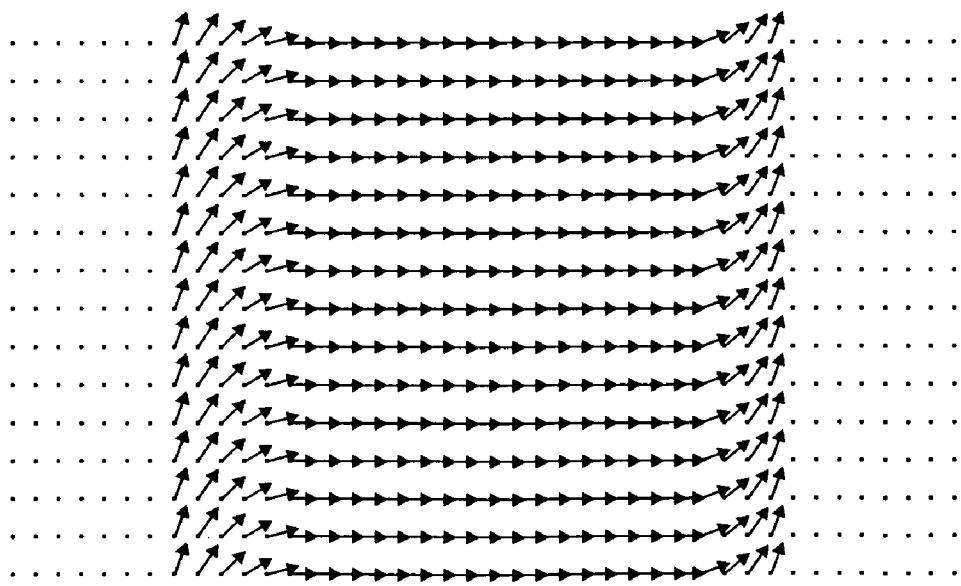

A smaller difference in the layer thicknesses of the reference layer structure 306-$n$ ($n=1$, 2) and the pinned ferromagnetic layer structure 307-$n$ ($n=1$, 2) results in a smaller net magnetic moment, which leads to a poorer alignment in a magnetization field 350. This connection is depicted in FIG. 7C for a layer thickness ratio $D_{PL,n}/D_{RL,n}$=22/18 ($n=1$, 2) with a magnetization field strength of 20 mT to 30 mT. FIG. 7D shows a top view of the reference magnetization direction of a reference layer structure 306-$n$ ($n=1$, 2) of a strip having a width of 1 µm with a layer thickness ratio $D_{PL,n}/D_{RL,n}$=18/22 ($n=1$, 2) with a magnetization field strength of 20 mT to 30 mT.

Due to the fact that the magnetization field 350 which is possible at the most for this case is restricted to about 30 mT to 40 mT, as was previously described with reference to FIG. 5, it is, in particular, the edge magnetizations which in this context can no longer be fully directed in the direction of the external magnetization field 350. The applicable magnetization field range is reduced to about 20 mT to 30 mT with the above layer thickness ratios.

Figure 8:
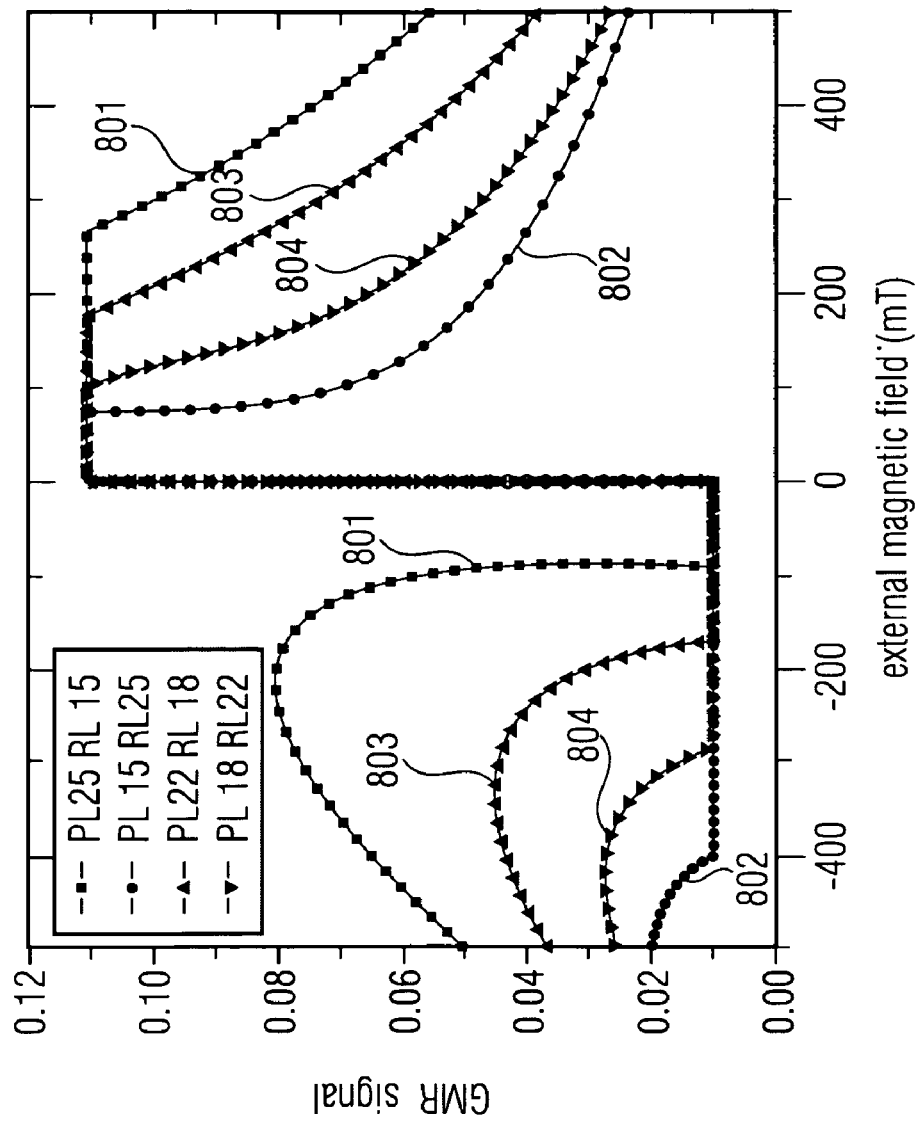
FIG. 8 depicts a representation of a large-field behavior of an xMR signal for different layer thickness ratios in accordance with embodiments of the present invention.

Different layer thickness ratios of thicknesses of the ferromagnetic pinned layer structure 307-$n$ ($n=1, 2$) to the thickness of the reference layer structure 306-$n$ ($n=1, 2$) have an impact on a resistance response of the respective spin-valve arrangements of a magnetic field sensor structure in accordance with embodiments of the present invention as a function of an externally applied magnetic field. A resistance response as a function of an externally applied magnetic field is generally also referred to as a large-field behavior or a so-called major loop. FIG. 8 shows various major-loop characteristics for various layer thickness ratios $D_{PL,n}/D_{RL,n}$ ($n=1, 2$).

The curve 801 shown in FIG. 8 corresponds to a layer thickness ratio $D_{PL,n}/D_{RL,n}=25/15$ ($n=1, 2$). The curve 802 shown corresponds to a layer thickness ratio $D_{PL,n}/D_{RL,n}=15/25$ ($n=1, 2$). The curve 803 belongs to a layer thickness ratio $D_{PL,n}/D_{RL,n}=22/18$ ($n=1, 2$). The curve 804 corresponds to a layer thickness ratio $D_{PL,n}/D_{RL,n}=18/22$ ($n=1, 2$). The curves 801 to 804 are based on simulations in accordance with the so-called Stoner-Wohlfahrt model.

The high-resistance range, i.e., the range having a high GMR signal, describes that range wherein an external magnetic field to be sensed magnetizes the free layer 302-$n$ ($n=1, 2$) in a manner which is essentially opposed to the reference magnetization direction of the reference layer 306-$n$ ($n=1, 2$). Conversely, in the low-resistance range, i.e., the range having low GMR signals, the magnetization direction of the free layer 302-$n$ ($n=1, 2$) is essentially unidirectional with the reference magnetization direction of the reference layer 306-$n$ ($n=1, 2$). In other words, in the high-resistance range, the magnetization direction of the free layer 302-$n$ ($n=1, 2$) equals the magnetization direction of the pinned ferromagnetic layer 307-$n$ ($n=1, 2$), and in the low-resistance range, the magnetization of the free layer 302-$n$ ($n=1, 2$) is opposed to the magnetization direction of the pinned ferromagnetic layer structure 307-$n$ ($n=1, 2$).

With a layer thickness ratio $D_{PL,n}/D_{RL,n}$ ($n=1, 2$) greater than 1, i.e., the thickness of the pinned ferromagnetic layer structure 307-$n$ ($n=1, 2$) is larger than the thickness of the reference layer structure 306-$n$ ($n=1, 2$), a relatively distinct high-resistance range may be seen in FIG. 8 (curves 801, 803), but with layer thickness ratios $D_{PL,n}/D_{RL,n}$ ($n=1, 2$) greater than 1, a low-resistance plateau width is relatively small. Influence variables for the high-resistance plateau width are essentially the antiferromagnetic coupling strength between the pinned ferromagnetic layer structure 307-$n$ ($n=1, 2$) and the reference layer structure 306-$n$ ($n=1, 2$), which is due to the RKKY interaction, in combination with a smaller influence of the pinning strength of the pinned ferromagnetic layer structure 307-$n$ ($n=1, 2$), i.e., the exchange-bias interaction with the natural antiferromagnet 310-$n$ ($n=1, 2$).

The width of the plateau in the low-resistance range is determined essentially by the field strength of the pinning of the pinned ferromagnetic layer structure 307-$n$ ($n=1, 2$) to the natural antiferromagnet 310-$n$ ($n=1, 2$). This means that with layer thickness ratios $D_{PL,n}/D_{RL,n}$ ($n=1, 2$) smaller than 1, the antiferromagnetic coupling between layers 306-$n$ ($n=1, 2$) and 307-$n$ ($n=1, 2$) is relatively small, whereas the pinning field strength between the pinned ferromagnetic layer structure 307-$n$ ($n=1, 2$) and the natural antiferromagnet 310-$n$ ($n=1, 2$) is comparatively high. With layer thickness ratios $D_{PL,n}/D_{RL,n}$ ($n=1, 2$) greater than 1, the exact opposite is true.

Since the layer thicknesses $D_{RL,n}$ ($n=1, 2$) of the reference layer structure 306-$n$ ($n=1, 2$) and the layer thicknesses $D_{PL,n}$ ($n=1, 2$) of the pinned ferromagnetic layer structure 307-$n$ ($n=1, 2$) determine the effective respective magnetic moment, the major loop is clearly influenced by this layer thickness ratio $D_{PL,n}/D_{RL,n}$ ($n=1, 2$).

One may see from FIG. 8 that, in order to achieve very similar or symmetric magnetic behaviors of the first 320-1 and second 320-2 spin-valve arrangements of the magnetic field sensor structure 400, the layer thicknesses of the reference layer structures 306-$n$ ($n=1, 2$) and of the corresponding ferromagnetic pinned layer structures 307-$n$ ($n=1, 2$) should not be too different from each other. This forms a contrast to employing high magnetization field strengths. As was already described above with reference to FIG. 5, when utilizing high magnetization field strengths in a magnetization write-in process, a correspondingly large difference between the layer thicknesses $D_{PL,n}/D_{RL,n}$ ($n=1, 2$) is desirable.

All in all, the following criteria result for adjusting the layer thickness ratios of the reference layer structure 306-$n$ ($n=1, 2$) and of the ferromagnetic layer structure 307-$n$ ($n=1, 2$) of the first 320-1 and second 320-2 magnetoresistive elements of a magnetic field sensor structure in accordance with embodiments:

identical to very similar xMR signals of both magnetoresistive elements (i.e. layer thickness ratio $D_{PL,n}/D_{RL,n}$ ($n=1, 2$) close to 1);

identical to very similar layer resistances of both xMR elements (this may also be achieved by adapting the remaining layer thicknesses);

high level of magnetizability also of the magnetizations in the edge areas within a magnetization field window having as large a width as possible (i.e., layer thickness ratio $D_{PL,n}/D_{RL,n}$ ($n=1, 2$) clearly different from 1, if at all possible) sufficiently large plateau widths for both sensors 320-$n$ ($n=1, 2$).

By means of suitable layer thickness ratios $D_{PL,n}/D_{RL,n}$ ($n=1, 2$), these criteria may be met, as was described above. In addition, in embodiments the layer thickness $D_{RL,1}$ of the first reference layer structure 306-1 deviates by no more than 75% of the layer thickness of the first reference layer structure from the layer thickness $D_{PL,1}$ of the first ferromagnetic layer structure 307-1, i.e., $0.25\, D_{RL,1} < D_{PL,1} < 1.75\, D_{RL,1}$. The layer thickness $D_{RL,2}$ of the second reference layer structure also deviates by no more than 75% of the layer thickness of the second reference layer structure from the layer thickness $D_{PL,2}$ of the second ferromagnetic layer structure, i.e., $0.25\, D_{RL,2} < D_{PL,2} < 1.75\, D_{RL,2}$.

Figure 9:
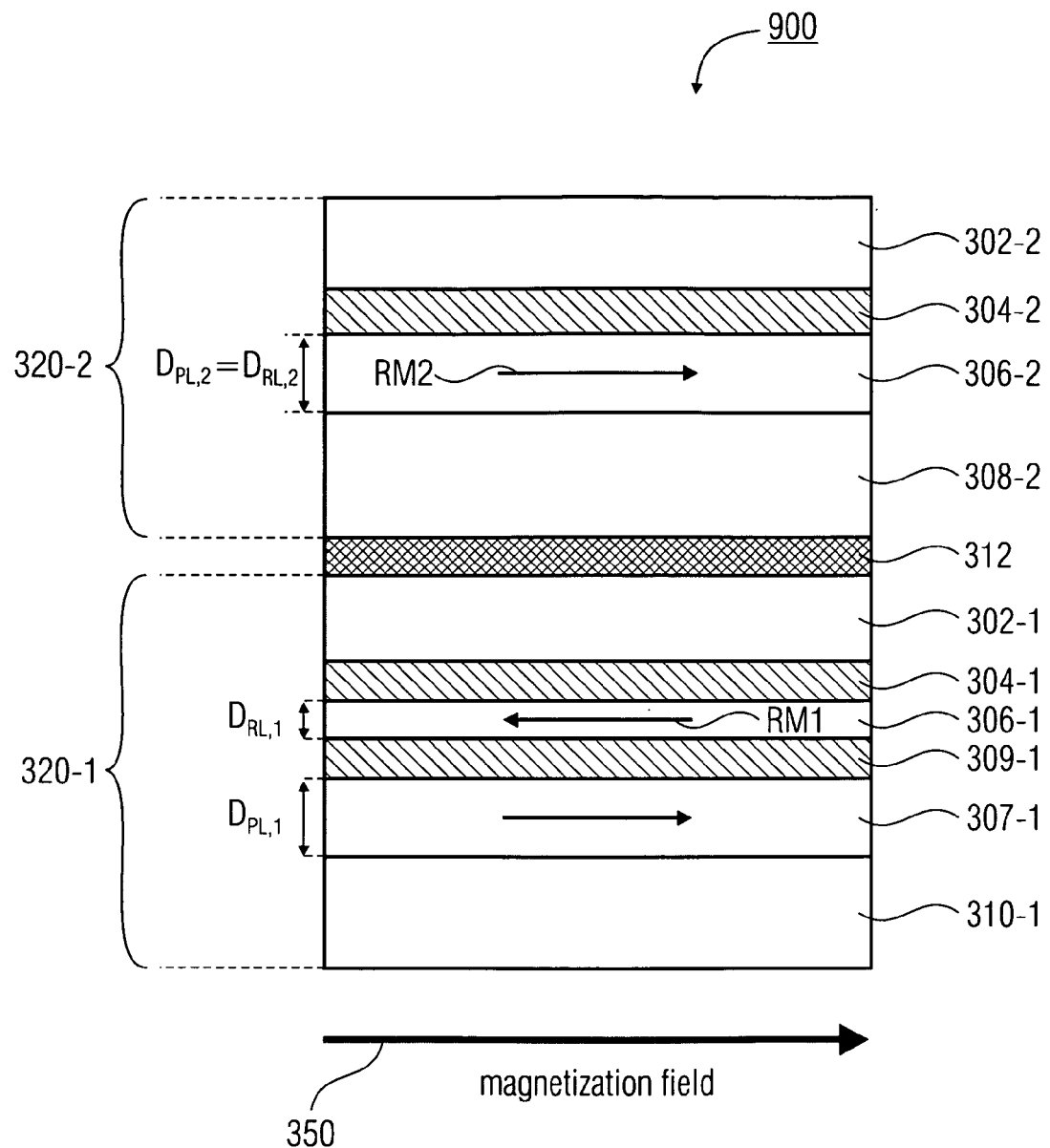
FIG. 9 shows a schematic cross-sectional view of a magnetic field sensor structure in accordance with further embodiments of the present invention.

A further embodiment of a magnetic field sensor structure is shown in FIG. 9.

In the embodiment shown in FIG. 9, the magnetic field sensor structure 900 comprises a first magnetoresistive element 320-1 in a spin-valve arrangement, as was already described with reference to FIG. 4. It is to be noted here that in the embodiment shown in FIG. 9 the layer thickness ratio $D_{PL,1}/D_{RL,1}$ of the thickness $D_{PL,1}$ of the first ferromagnetic layer structure 307-1 to the thickness $D_{RL,1}$ of the first reference layer structure 306-1 is greater than 1, i.e., $D_{PL,1}/D_{RL,1} > 1$.

As the reference layer 306-2, the second magnetoresistive element 320-2 only comprises a pinned layer above the natural antiferromagnet 308-2. Such a spin-valve arrangement is referred to as "simple pinned" since it only comprises a pinned layer structure 306-2 which at the same time serves as a reference layer structure. It was already described above with reference to FIG. 1B.

In a magnetization process of the magnetic field sensor structure 900 shown in FIG. 9, there is no upper limit to a magnetization field strength, unlike the structure described in FIG. 4, which has the advantage of potential processing in pre-existing magnetic ovens with only a fixed, high magnetization field strength. As was already mentioned at the outset, in the structure 900 shown in FIG. 9, magnetic behaviors of the top and bottom sub-sensors may be different because of a considerable magnetostatic stray field of the second reference layer structure 306-2 (pinned layer). For some applications, this does not represent an impairment, so that the embodiment shown in FIG. 9 represents a process-optimized variant of the embodiment shown in FIG. 4.

A method of manufacturing a magnetic field sensor structure in accordance with FIG. 9 thus comprises arranging a first magnetoresistive element 320-1 in a spin-valve arrangement with a first reference layer structure 306-1 with a layer thickness $D_{RL,1}$ and a first ferromagnetic layer structure 307-1 with a layer thickness $D_{PL,1}$, and arranging a second magnetoresistive element 320-2, vertically above the first magnetoresistive element 320-1 and galvanically isolated from same by the isolating barrier 312, in a spin-valve arrangement with a second reference layer 306-2, a first layer thickness ratio of the layer thickness $D_{PL,1}$ to the layer thickness $D_{RL,1}$ being greater than 1. In addition, the method of manufacturing a magnetic field sensor structure 900 in accordance with FIG. 9 comprises exposing the first magnetoresistive element 320-1 and the second magnetoresistive element 320-2 to a magnetization field 350 with an advantageous magnetization direction during a magnetization write-in process in order to obtain different reference magnetization directions in the first and second reference layer structures 306-1 and 306-2. In particular, opposed reference magnetization directions are obtained, in the magnetization write-in process, in the first and second reference layer structures 306-1 and 306-2. In this context, the magnetization field 350 may have a field strength of at least 5 mT. It is advantageous to select a field strength of the magnetization field 350 to be larger than 20 mT.

A layer thickness ratio $D_{PL,1}/D_{RL,1}$ greater than 1 here results in that the magnetization directions of the ferromagnetic pinned layer structures 306-2 and 307-1 are each unidirectional. The magnetization direction of the pinned layer structure 306-2 simultaneously represents the reference magnetization direction of the second, top magnetoresistive element 320-2. The reference magnetization of the bottom, first magnetoresistive element 320-1 results from the antiferromagnetic coupling of the first reference layer structure 306-1 to the pinned layer structure 307-1, which is opposed to the reference magnetization of the second reference layer structure 306-2.

In addition to the embodiments described above with reference to FIGS. 2 to 9, wherein reference magnetization directions RM1 and/or RM2 may be adjusted by layer thickness ratios $D_{PL,n}/D_{RL,n}$ (n=1, 2), further embodiments of the present invention comprise magnetic field sensor structures wherein the reference magnetization directions RM1 and RM2 of the first magnetoresistive element 320-1 and of the second magnetoresistive element 320-2 may be adjusted, in each case, by a different, i.e., even and odd number of ferromagnetic layer structures antiferromagnetically coupled to one another. In this context, FIG. 10 shows a magnetic field sensor structure 1000 in accordance with an embodiment of the present invention.

Figure 10:
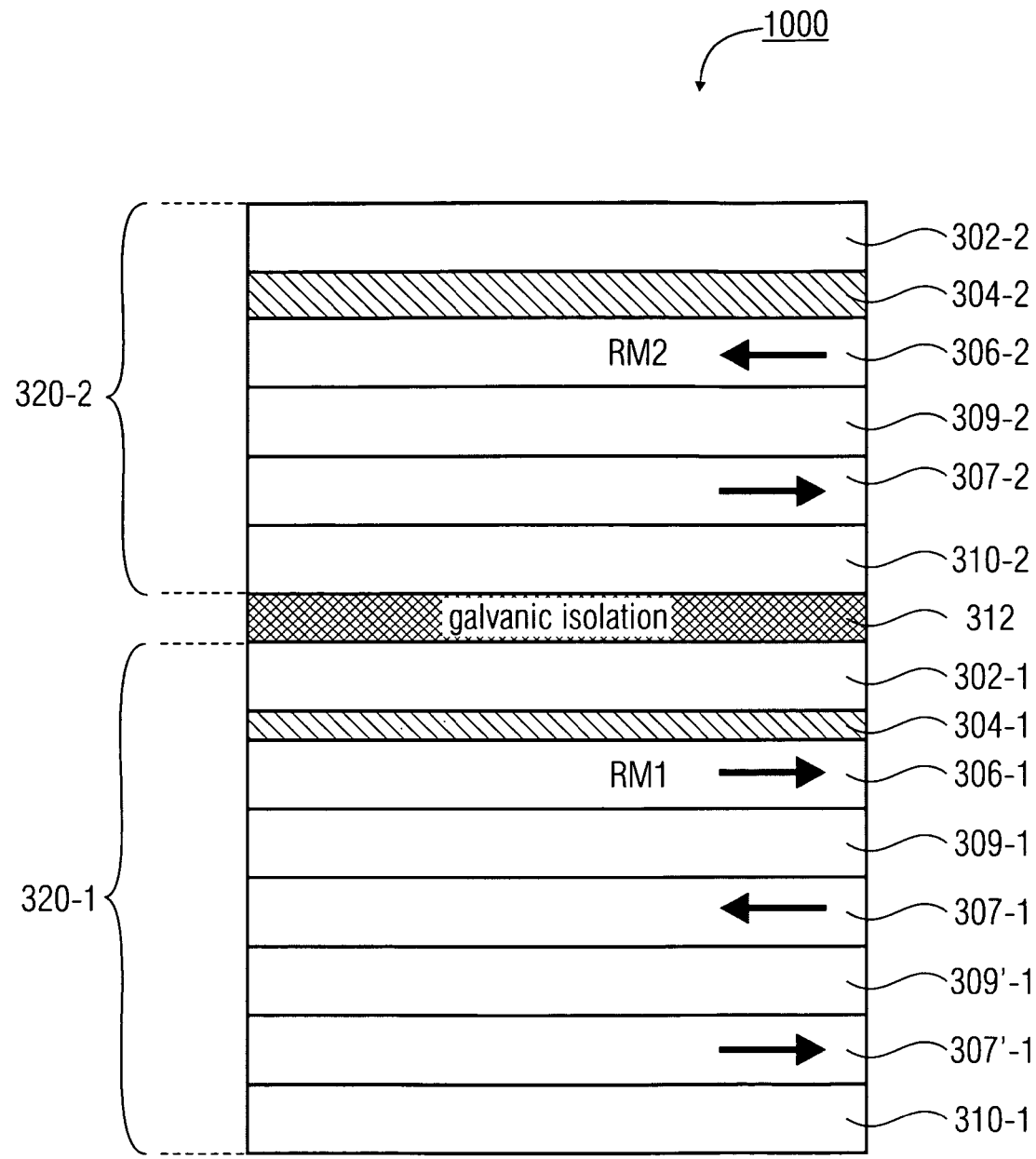
FIG. 10 shows a schematic cross-sectional view of a magnetic field sensor structure in accordance with a further embodiment of the present invention.

The magnetic field sensor structure 1000 shown in FIG. 10 comprises a first magnetoresistive element 320-1 in a spin-valve arrangement and a second magnetoresistive element 320-2 in a spin-valve arrangement. The first magnetoresistive element 320-1 comprises three ferromagnetic layer structures 306-1, 307-1 and 307'-1 isolated by non-magnetic layers 309-1, 309'-1 and antiferromagnetically coupled after a magnetization process. The second magnetoresistive element 320-2 comprises two ferromagnetic layer structures 306-2 and 307-2 isolated by a non-magnetic layer 309-2 and antiferromagnetically coupled after the magnetization process. In this context, the antiferromagnetic coupling results, for example, from the RKKY interaction.

In the embodiment shown in FIG. 10, the layer thicknesses of the ferromagnetic layers 306-1, 307-1 and 307'-1 or 306-2 and 307-2 are largely irrelevant for adjusting the respective reference magnetizations RM1, RM2 of the reference layer structures 306-1, 306-2—provided that the field strength of the magnetization field 350 is high enough to break up the RKKY interaction, for example, higher than 500 mT. In this case, the different, in particular, opposed, reference magnetization directions RM1 and RM2 may, rather, be determined by the respective number of the antiferromagnetically coupled ferromagnetic layers in the magnetoresistive elements 320-1, 320-2. To this end, in one of the two magnetoresistive elements (here 320-1), a number "a" of the antiferromagnetically coupled ferromagnetic layer structures is to be selected to be odd, i.e. a=2x+1 (x=0, 1, 2, 3, . . . ), whereas in the other magnetoresistive element (here 320-2), a number "b" of the antiferromagnetically coupled ferromagnetic layer structures is to be selected to be even, i.e., b=2y (y=1, 2, 3, . . . ). In this context, a difference between a and b may amount to 1, as is depicted in FIG. 10, but may quite possibly be greater than 1. Due to the respectively opposed magnetization directions of two adjacent antiferromagnetically coupled ferromagnetic layer structures, respectively opposed reference magnetization directions RM1 and/or RM2 thus result for the reference layer structures 306-n (n=1, 2), as is depicted in FIG. 10 by way of example.

In order to keep the manufacture of a magnetic field sensor structure 1000 as simple as possible, the layer thicknesses of the individual antiferromagnetically coupled ferromagnetic layer structures are selected to be identical in accordance with an embodiment.

Of course, in embodiments of the present invention, the layer thicknesses of the antiferromagnetically coupled ferromagnetic layers may also be selected to be different. With a sufficiently large magnetization field 350 in a magnetization write-in process, all of the ferromagnetic layers will align in the direction of the magnetization field direction. Due to the exchange-bias interaction, this magnetization field direction is retained in the pinned layers 307'-1 and 307-2 while the magnetic field sensor 1000 cools down. The magnetizations of the ferromagnetic layers 307-1 and/or 306-2 which are located above them, respectively, each point to the direction opposed to the pinned layers 307'-1 and/or 307-2 on account of the antiferromagnetic coupling. While the ferromagnetic layer structure 306-2 is already the reference layer of the second magnetoresistive element 320-2, and while its magnetization direction thus is equal to the reference magnetization direction RM2, a further ferromagnetic layer structure 306-1, in turn antiferromagnetically coupled to the ferromagnetic layer structure 307-1, follows above the ferromagnetic layer structure 307-1 of the first magnetoresistive element 320-1, so that the magnetization direction of same is again opposed to the magnetization direction of the layer structure 307-1. Since the layer structure 306-1 is the reference layer of the first magnetoresistive element 320-1, its magnetization direction thus corresponds to the reference magnetization direction RM1, which is opposed to the reference magnetization direction RM2.

Accordingly, a method of producing a magnetic field sensor structure 1000 comprises arranging the first magnetoresistive element 320-1 in a spin-valve arrangement with an odd number of ferromagnetic layer structures 306-1, 307-1, 307'-1 which may be antiferromagnetically coupled to one other, arranging the second magnetoresistive element 320-2, vertically above the first magnetoresistive element 320-1 and galvanically isolated therefrom by the isolating barrier 312, in a spin-valve arrangement with an even number of ferromagnetic layer structures 306-2, 307-2 which may be antiferromagnetically coupled to one other. In addition, the method comprises exposing the first magnetoresistive element 320-1 and the second magnetoresistive element 320-2 to a magnetization field 350 with an advantageous magnetization direction during a magnetization write-in process in order to obtain a first ferromagnetic reference layer structure 306-1 of the first magnetoresistive element 320-1 and a second ferromagnetic reference layer structure 306-2 of the second magnetoresistive element 320-2, which comprise different reference magnetization directions RM1, RM2.

In this context, the reference layer structures 306-$n$ (n=1, 2) form topmost and bottommost layer structures, respectively, of a layer structure stack consisting of the antiferromagnetically coupled ferromagnetic layer structures, depending on whether the arrangement is a bottom-pinned spin-valve arrangement or a top-pinned spin-valve arrangement.

By using an odd number (a>2) of ferromagnetic layer structures in the first magnetoresistive element 320-1, and an even number (b≧2) of ferromagnetic layer structures in the second magnetoresistive element 320-2, by suitably selecting the layer thicknesses and/or the materials of the antiferromagnetically coupled ferromagnetic layer structures, magnetic stray fields resulting therefrom in the respective free layer 302-$n$ (n=1, 2) may be compensated for, so that in an idle state (i.e., without an external magnetic field being applied) the respective free layer 302-$n$ (n=1, 2) "sees" no magnetic field of the antiferromagnetically coupled ferromagnetic layer structures. Compensation of the stray fields thus becomes possible particularly when at least two ferromagnetic layer structures are present in each reference system. In this manner, the stray field of each individual reference system may be minimized, or adjusted in a targeted manner.

In addition to the advantage of being able to set to zero resulting stray fields at the location of the free layer 302-$n$ (n=1, 2), it is also possible, of course, to set defined values of a resulting stray field to a number different from zero at the location of the free layer 302-$n$ (n=1, 2). This may be important, for example, when an application may benefit from a defined shift in a small-field characteristic.

Figure 11A:
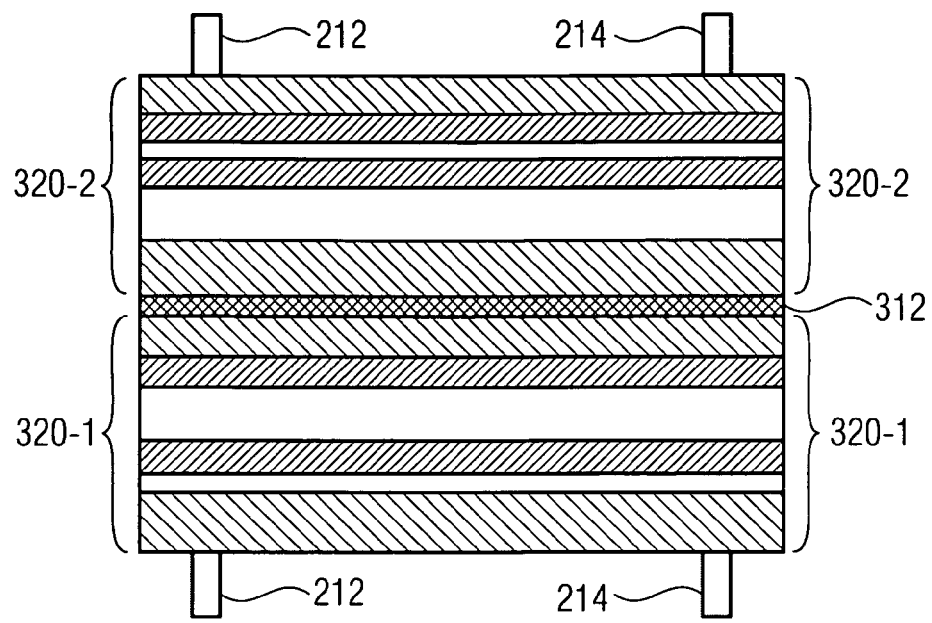
FIG. 11A and FIG. 11B show representations of electric contacting possibilities for a magnetic field sensor structure in accordance with embodiments of the present invention.
Figure 11B:
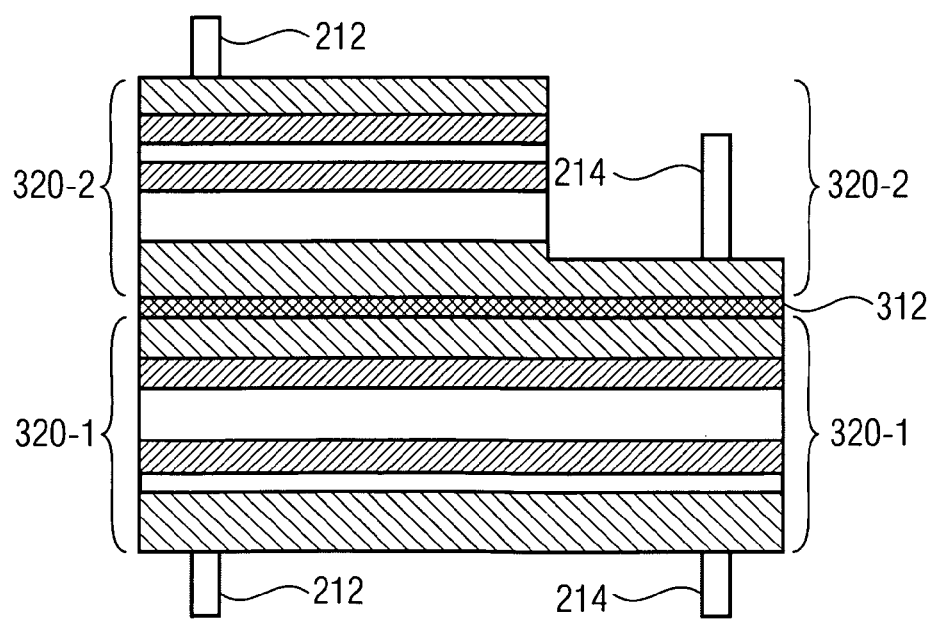

Both the first magnetoresistive element 320-1 and the second magnetoresistive element 320-2 are electrically contacted, in embodiments, by contactings in each case. FIGS. 11A and 11B show two potential contacting variants for the first 320-1 and second 320-2 magnetoresistive elements of a magnetic field sensor structure in accordance with embodiments of the present invention.

FIG. 11A schematically shows a variant wherein the bottom sub-sensor or the bottom, first magnetoresistive element 320-1 is electrically connected from the bottom by means of contacting areas 212, 214. The top sub-sensor, or the second magnetoresistive element 320-2, however, is electrically connected from the top by means of contacting areas 212, 214. The contacting variant represented in FIG. 11A is suited, in particular, to connect GMR sensors, but also to contact TMR layer structures which are operated in the CIPT configuration discussed at the outset.

In the embodiment shown in FIG. 11B, the top sub-sensor, or the second magnetoresistive element 320-2, is electrically connected from the bottom via the natural antiferromagnet 310-2, and via a top contact. The bottom sub-sensor, or the first magnetoresistive element 320-1, is connected from the bottom, just as in the example shown in FIG. 11A. In this context, in a bottom-pinned spin-valve arrangement, the bottom is formed by the natural antiferromagnet 310. In a bottom-pinned spin-valve arrangement, the top is formed by the free ferromagnetic layer 302. The opposite is true for the top-pinned spin-valve arrangements already described above. The contacting variant depicted in FIG. 11B is particularly suitable when, for example, the top sub-sensor 320-2 is designed as a TMR structure and is to be operated in a CPP configuration.

It shall be noted at this point that a floor space of the sub-sensor 320-2, which is the top sub-sensor in terms of process engineering, generally does not exceed a floor space of the bottom sub-sensor 320-1 in accordance with embodiments. This means that the floor space of the bottom sub-sensor 320-1 is larger than or equal to the floor space of the top sub-sensor 320-2. A stepped arrangement of the two sub-sensors "from the bottom to the top" is also feasible.

Methods and devices for measuring a magnetic field and/or a magnetic field change with one or more magnetic field sensor structure(s) in accordance with embodiments will be described below with reference to FIG. 11 and FIG. 12.

Figure 12A:
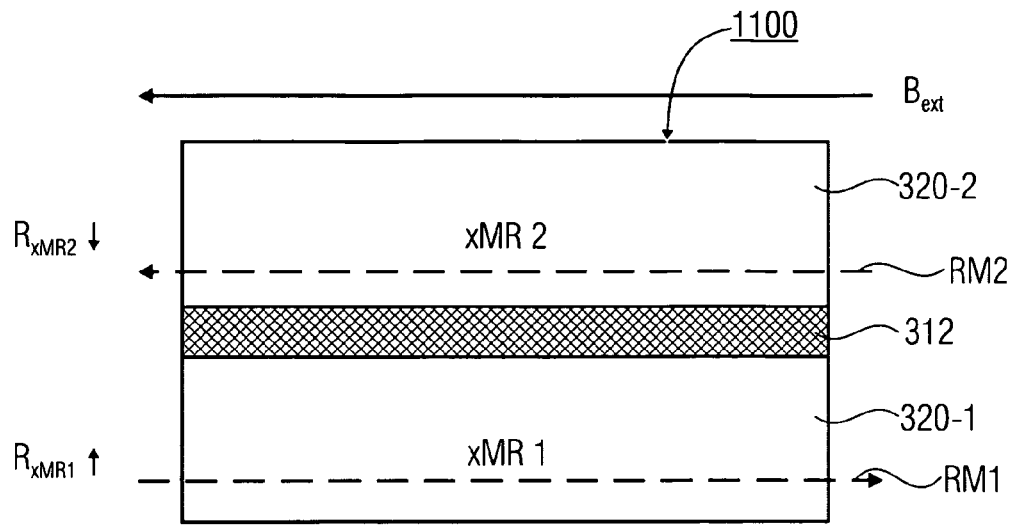
FIGS. 12A and 12B show representations of a connection of a magnetic field sensor structure in a Wheatstone half-bridge in accordance with embodiments of the present invention.

FIG. 12A schematically shows a magnetic field sensor structure 1100 in accordance with embodiments, which is exposed to an external magnetic field $B_{EXT}$ to be measured which comprises a component which is lateral to the layer arrangement of the layer stack of the magnetic field sensor structure 1100. This means that a layer stack consisting of a first magnetoresistive element 320-1 is arranged in a spin-valve arrangement with a first reference layer structure with a first reference magnetization direction RM1 and of a second magnetoresistive element 320-2, galvanically isolated from the first magnetoresistive element 320-1, in a spin-valve arrangement with a second reference layer structure with a second reference magnetization direction RM2, the first and second reference magnetization directions being different, in particular opposed to each other.

Figure 12B:
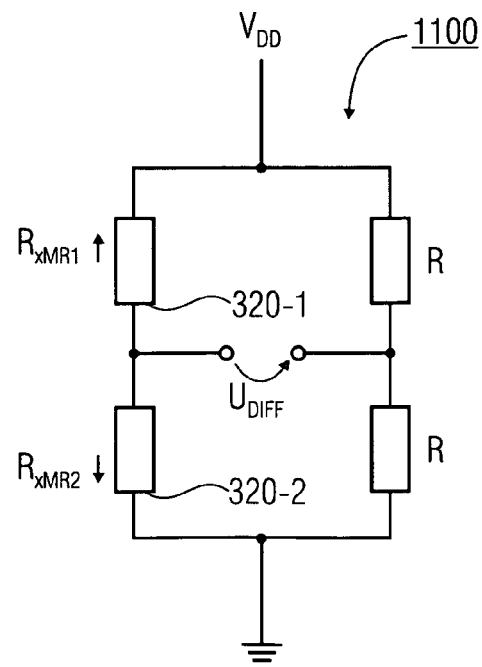

In this context, the first and second magnetoresistive sensor elements 320-1 and 320-2 are arranged in a bridge circuit such that, due to the inverse change in the resistance values $R_{xMR1}$ of the first magnetoresistive element 320-1 and $R_{xMR2}$ of the second magnetoresistive element 320-2, a signal $U_{DIFF}$ is detectable proportionally to the magnetic field $B_{EXT}$ and/or to the magnetic field change between two bridge arms of the bridge circuit. In this context, FIG. 12B shows a so-called Wheatstone measuring bridge comprising a parallel connection of two voltage dividers. The left-hand arm, shown in FIG. 12B, of the Wheatstone measuring bridge comprises, for example, a series connection of the two xMR elements 320-1 and 320-2 with resistances $R_{xMR1}$ and $R_{xMR2}$. The right-hand arm of the Wheatstone measuring bridge comprises a series connection of two reference resistances R equal in size. In addition, the Wheatstone measuring bridge is connected between a supply potential VDD and a ground potential, and it may provide an output signal $U_{DIFF}$ between the two center taps of the bridge circuit.

The measuring bridge is adjusted when the bridge diagonal voltage $U_{DIFF}$ equals zero, i.e., when the resistance ratio in the two voltage dividers is the same. If the magnetic field sensor structure 1100 shown in FIG. 12A is brought into the external magnetic field $B_{EXT}$ to be sensed, the resistance $R_{xMR1}$ of the first xMR structure 320-1 will increase, whereas the resistance R xMR2 of the second xMR structure 320-2 will decrease. This results in a shift in the resistance ratio $R_{xMR1}/R_{xMR2}$, and a voltage $U_{DIFF}$ proportional to the external magnetic field $B_{EXT}$ may be measured between the two center taps of the Wheatstone measuring bridge.

Figure 13A:
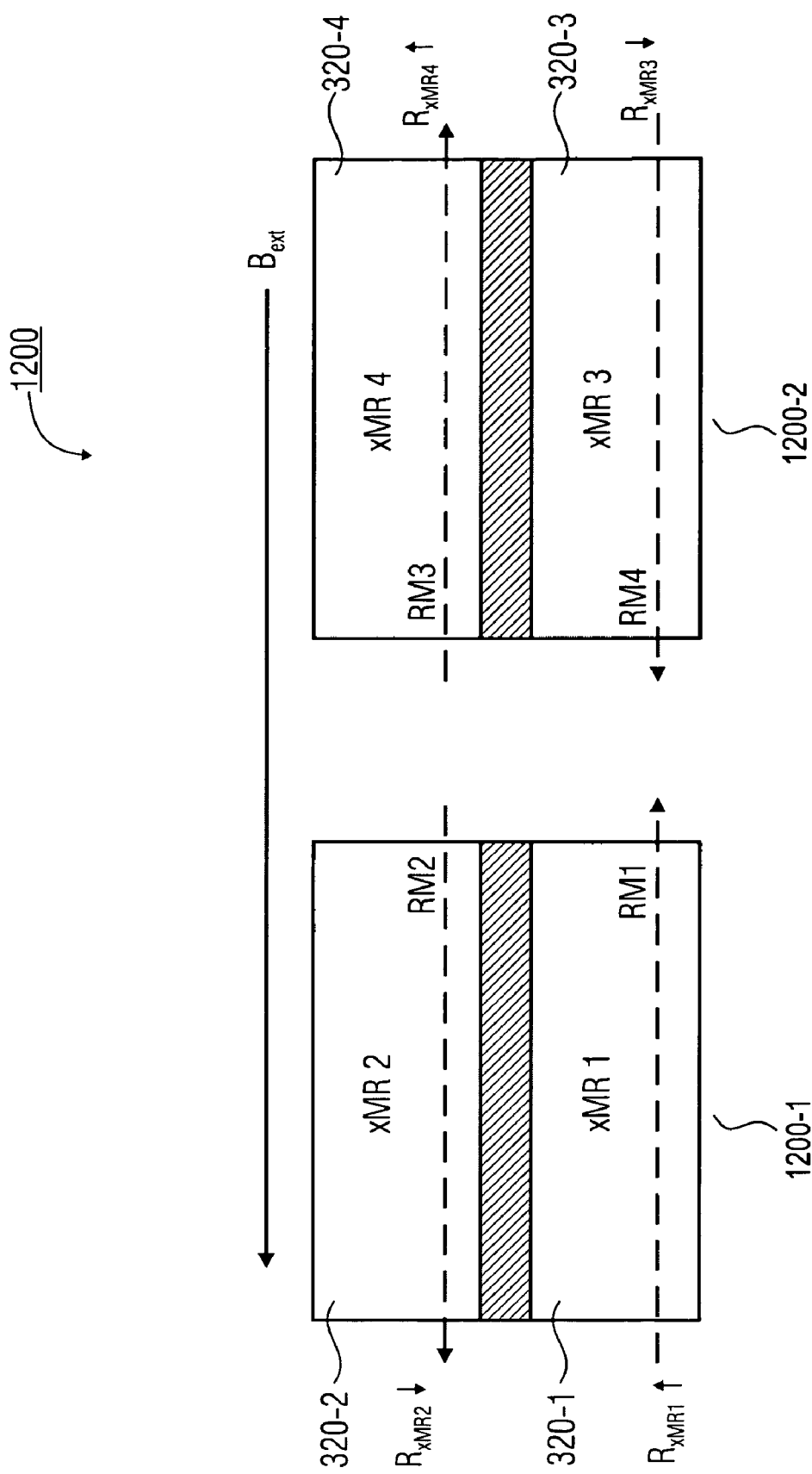
FIGS. 13A to 13C show representations of a connection of two magnetic field sensor structures in a Wheatstone full-bridge in accordance with embodiments of the present invention.
Figure 13B:
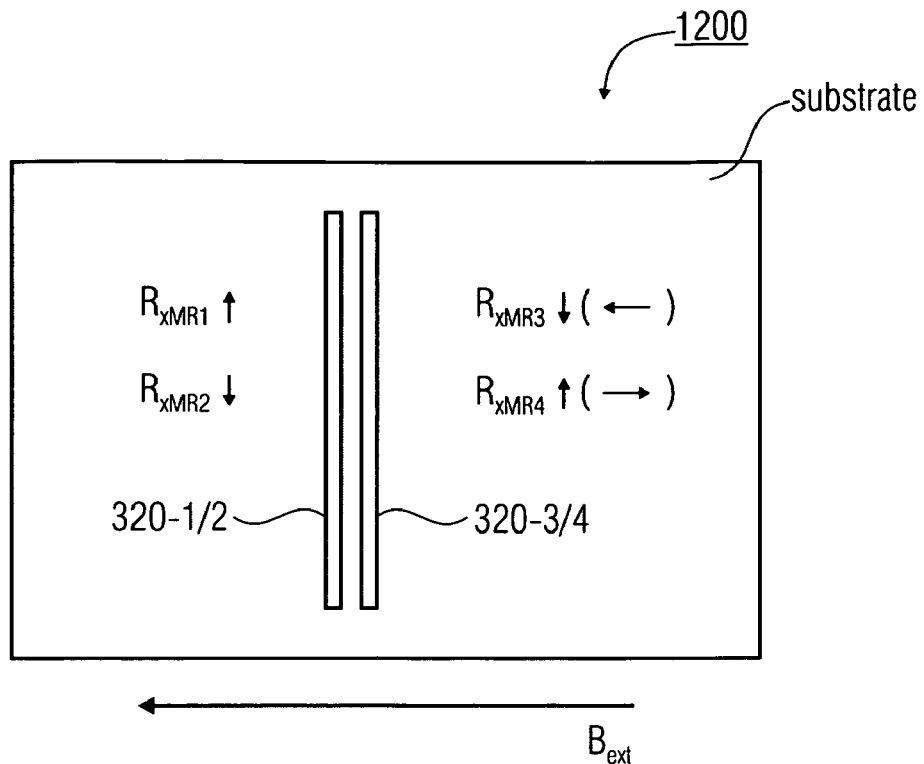
Figure 13C:
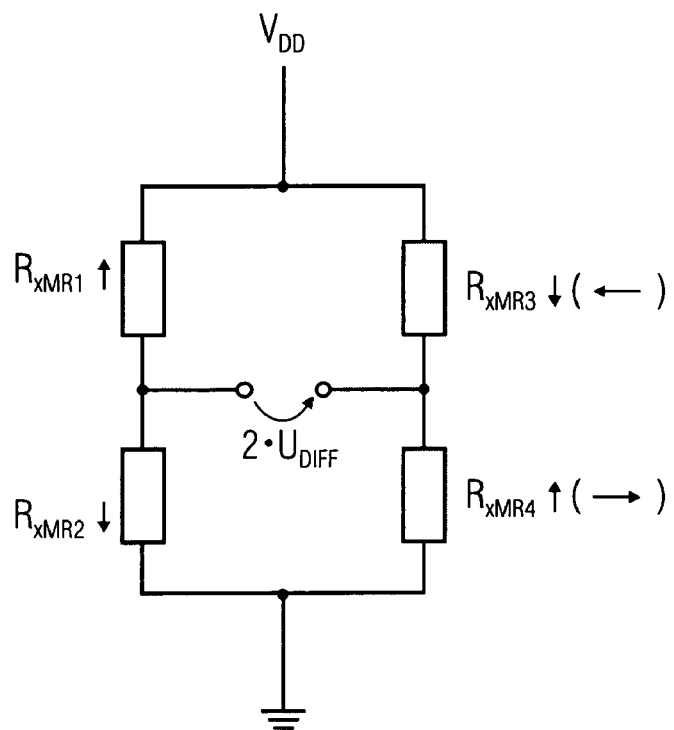

Doubling of the difference voltage $U_{DIFF}$ may be achieved, for example, when two magnetic field sensor structures in accordance with embodiments are adjacently placed into an external magnetic field $B_{EXT}$ to be measured, as is schematically shown in the side view of FIG. 13A, in the top view of FIG. 13B and in FIG. 13C.

In this context, the reference magnetization directions RM1, RM2, RM3, RM4 of the reference layer structures are aligned, for example, as depicted in FIG. 13A. Thus, one may achieve that two xMR sub-sensors 320-n (n=1, . . . , 4), respectively, increase their resistances, and that two decrease their resistances. In the example depicted in FIG. 13A, for example, the first magnetoresistive element 320-1 of the first magnetic field sensor structure 1200-1 increases its resistance $R_{xMR1}$, and the second magnetoresistive element 320-4 of the second magnetic field sensor structure 1200-2 increases its resistance $R_{xMR4}$. The second magnetoresistive element 320-2 of the first magnetic field sensor structure 1200-1, and the first magnetoresistive element 320-3 of the second magnetic field sensor structure 1200-2 decrease their resistances $R_{xMR2}$ and $R_{xMR3}$ in the configuration depicted in FIG. 13A.

If the four magnetoresistive elements 320-1 to 320-4 are connected to form a Wheatstone measuring bridge, as is depicted in FIG. 13B, a difference signal $2U_{DIFF}$, which is double in size compared to FIG. 12B, may be obtained. In addition, temperature dependencies, environmental influences, etc., such as temperature variations, may be compensated for.

In order to realize a 360° detection by means of a magnetic field detection device from a plurality of magnetic field sensor structures in accordance with embodiments of the present invention, for example, in order to detect the direction of rotation of a wheel or a shaft, for example, four magnetic field sensor structures in accordance with embodiments (eight magnetoresistive elements) are connected to form two Wheatstone bridge arrangements (connected in parallel), one of the bridge circuits comprising reference magnetizations aligned perpendicular to those of the other bridge circuit (as is depicted in FIGS. 13B,C by the magnetization directions indicated in brackets). Within each bridge circuit consisting of two magnetic field sensor structures in accordance with embodiments (four magnetoresistive elements), the reference magnetizations are arranged in an anti-parallel manner, so that both bridge circuits provide sinusoidal signals which are dependent on the angle of rotation of an external magnetic field and are shifted in phase to one another by 90°. The angle may be unambiguously determined within a 360° range by means of an arctan calculation of both output signals, i.e., of the output signals of the first and second bridge circuits.

In embodiments of the present invention, a so-called back-bias magnet may be mounted below or above the magnetic field sensor structure 1100 or 1200 so as to provide a bias magnetic field. In this context, the back-bias magnet is arranged such that the field lines of the bias magnetic field extend almost perpendicularly to the layer stack consisting of the first and second (and third and fourth) magnetoresistive elements. As was already mentioned at the outset, such an arrangement may be employed as a speed sensor so as to detect, for example, rotational speeds of ferromagnetic toothed wheels which influence the bias magnetic field while rotating.

In an arrangement in accordance with FIG. 12A, two xMR spin-valve arrangements may now be used which are advantageously mounted in a chip center of a sensor chip for avoiding parasitic lateral or in-plane magnetic fields when using back-bias magnets. For detecting the direction of rotation of a transmitter wheel, in the embodiment in FIG. 12 one of the four sub-sensors 320-1 to 320-4 may readily be used directly, so that no further sensor element may be used for detecting the direction of rotation.

In summary, embodiments of the present invention provide a magnetic field sensor structure consisting of a combination of two spin-valve structures vertically arranged above each other and comprising different reference systems in each case with which an opposed or anti-parallel alignment of the respective reference magnetizations is achieved in a magnetization process.

In embodiments, a first layer thickness ratio $D_{PL,1}/D_{RL,1}$ of a thickness $D_{PL,1}$ of a first ferromagnetic layer structure to a thickness $D_{RL,1}$ of the first reference layer structure is greater than 1, and a second layer thickness ratio $D_{PL,2}/D_{RL,2}$ of a thickness $D_{PL,2}$ of the second ferromagnetic layer structure to a thickness $D_{RL,2}$ of the second reference layer structure is smaller than 1.

In further embodiments, an odd number of antiferromagnetically coupled ferromagnetic layer structures are arranged in the first magnetoresistive element 320-1, and an even number of antiferromagnetically coupled ferromagnetic layer structures are arranged in the second magnetoresistive element 320-2, so as to obtain an opposed or anti-parallel alignment of the respective reference magnetizations.

Both magnetoresistive elements are arranged above each other in a process-optimized manner. In this manner, it is possible, in a location, to determine a strength/direction of a magnetic field to be sensed, and to generate an advantageous differential output signal by means of the combination of the inverse magnetic characteristics of the two xMR spin-valve structures.

By using GMR and/or TMR technologies, a clear advantage with regard to sensitivity and jitter may be achieved in speed measurement over established Hall and AMR technologies. Unlike AMR technology, no supporting magnetic fields may be used in embodiments of the present invention, which avoids additional and unnecessary cost.

For detecting magnetic field changes caused, for example, by a toothed wheel, a so-called back-bias magnet is often mounted to a rear side of a sensor chip, the back-bias magnet generating a bias magnetic field with a magnetization direction perpendicular to the chip surface. At the edge of a back-bias magnet, so-called in-plane components, i.e., magnetic field components parallel to the chip surface, occur. These in-plane components interfere, for example, with the detection of magnetic field changes using a spatially separate arrangement of conventional spin-valve structures. A magnetic field sensor structure in accordance with embodiments of the present invention may both increase and decrease its resistance at the same location on a sensor chip with a specific magnetic field. Embodiments of the present invention enable this by impressing an inversely aligned reference magnetization direction of directly vertically adjacent individual GMR/TMR elements. A sensor arrangement in accordance with embodiments of the present invention thus obtains a differential output signal not because of a differential magnetic field by spatial separation of Wheatstone half-bridges, but because of a differential resistance change in a specific field caused by different or inverse characteristic curves of the xMR sensor elements employed. In this manner, a magnetic field sensor structure in accordance with embodiments of the present invention may be arranged, at a location, in the center of a sensor chip with regard to the back-bias magnet, where no or hardly any in-plane components of the bias magnetic field and, thus, no interferences caused thereby occur.

The inventive vertical arrangement of the spin-valve structures additionally comprises significant advantages over a spatially separate arrangement, for example, with regard to dimensions of a sensor chip surface area that may be used.

Finally, it is to be noted that the present invention is not limited to the respective magnetic field sensor structures described, or to the procedures explained, since these magnetic field sensor structures and methods may vary. The terms used here are only intended to describe particular embodiments, and are not used in a limiting sense. If the number or indefinite articles are used in the specification and in the claims, these shall also refer to the plurality of these elements, unless the overall context clearly indicates otherwise. The same also applies in the reverse sense.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A magnetic field sensor structure comprising:
    a first magnetoresistive element in a spin-valve arrangement with a first reference layer structure with a first reference magnetization direction and with a first ferromagnetic layer structure antiferromagnetically coupled to the first reference layer structure, wherein a first layer thickness ratio DPL,1/DRL,1 of a thickness DPL,1 of the first ferromagnetic layer structure to a thickness DRL,1 of the first reference layer structure is greater than 1, the first magnetoresistive element further comprising a third ferromagnetic layer structure and a first barrier layer structure, wherein the first barrier layer structure is arranged between the third ferromagnetic layer structure and the first reference layer, and wherein the first barrier layer is formed to magnetically decouple or to weakly couple the third ferromagnetic layer structure and the first reference layer structure; and
    a second magnetoresistive element in a spin-valve arrangement with a second reference layer structure with a second reference magnetization direction and with a second ferromagnetic layer structure antiferromagnetically coupled to the second reference layer structure, wherein a second layer thickness ratio DPL,2/DRL,2 of a thickness DPL,2 of the second ferromagnetic layer structure to a thickness DRL,2 of the second reference layer structure is smaller than 1, the second magnetoresistive element further comprising a fourth ferromagnetic layer structure and a second barrier layer structure, wherein the second barrier layer structure is arranged between the fourth ferromagnetic layer structure and the second reference layer structure, and wherein the second barrier layer structure is formed to magnetically decouple or to weakly couple the fourth ferromagnetic layer structure and the second reference layer structure,
    wherein the first and second magnetoresistive elements are arranged in a layer stack vertically above each other and galvanically isolated from each other by an intermediate layer, and wherein the first and second reference magnetization directions are different.

2. The magnetic field sensor structure as claimed in claim 1, wherein the first and second reference magnetization directions are opposed to each other.

3. The magnetic field sensor structure as claimed in claim 1, wherein the first layer thickness ratio $D_{PL,1}/D_{RL,1}$ is inverse to the second layer thickness ratio $D_{PL,2}/D_{RL,2}$.

4. The magnetic field sensor structure as claimed in claim 1, wherein a layer thickness $D_{RL,1}$ of the first reference layer structure deviates by no more than 75% of the layer thickness of the first reference layer structure from a layer thickness $D_{PL,1}$ of the first ferromagnetic layer structure.

5. The magnetic field sensor structure as claimed in claim 1, wherein a layer thickness $D_{RL,2}$ of the second reference layer structure deviates by no more than 75% of the layer thickness of the second reference layer structure from a layer thickness $D_{PL,2}$ of the second ferromagnetic layer structure.

6. The magnetic field sensor structure as claimed in claim 1, wherein the first reference layer structure is a topmost or bottommost ferromagnetic layer structure of a layer structure stack of an odd-numbered layer structures antiferromagnetically coupled to one another, and wherein the second reference layer structure is a topmost or bottommost ferromagnetic layer structure of a layer structure stack of an even-numbered layer structures antiferromagnetically coupled to one another.

7. The magnetic field sensor structure as claimed in claim 1, wherein the first and/or the second magnetoresistive element(s) is/are implemented as a GMR spin-valve element (GMR=giant magnetoresistance).

8. The magnetic field sensor structure as claimed in claim 1, wherein the first and/or the second magnetoresistive element(s) is/are implemented as a TMR spin-valve element (TMR=tunneling magnetoresistance).

9. The magnetic field sensor structure as claimed in claim 1, wherein the first and second reference magnetization directions are anti-parallel, and wherein changes in resistance values of the first and second magnetoresistive elements thus are opposed to each other.

10. The magnetic field sensor structure as claimed in claim 1, further comprising:
    a third magnetoresistive element in a spin-valve arrangement with a third reference layer structure with a third reference magnetization direction; and
    a fourth magnetoresistive element in a spin-valve arrangement with a fourth reference layer structure with a fourth reference magnetization direction,
    wherein the third and fourth magnetoresistive elements are arranged in a layer stack vertically above each other and galvanically isolated from each other by an intermediate layer structure, and wherein the third and fourth reference magnetization directions are opposed to each other; and
    wherein the first, second, third and fourth magnetoresistive elements are connected in a bridge circuit such that, due to an inverse change in resistance values of the first and second magnetoresistive elements and of the third and fourth magnetoresistive elements, a difference signal is detectable proportionally to the magnetic field and/or a magnetic field change between two bridge arms of the bridge circuit.

11. The magnetic field sensor structure as claimed in claim 1, wherein the third ferromagnetic layer structure forms a sensor layer of the first magnetoresistive element, and wherein the fourth ferromagnetic layer structure forms the sensor layer of the second magnetoresistive element.

12. The magnetic field sensor structure as claimed in claim 1, wherein the third ferromagnetic layer structure has a large lateral geometrical aspect ratio resulting in a magnetization direction of the third ferromagnetic layer structure which is perpendicular or approximately perpendicular to the reference magnetization direction of the first reference layer structure, and wherein the fourth ferromagnetic layer structure has a large lateral geometrical aspect ratio resulting in a magnetization direction of the fourth ferromagnetic layer structure which is perpendicular or approximately perpendicular to the reference magnetization direction of the second reference layer structure.

13. A magnetic field sensor structure as claimed in claim 1, wherein the first and second magnetoresistive elements are connected in a Wheatstone measuring bridge circuit such that due to the different reference magnetization directions and associated different changes in resistance values of two first and second magnetoresistive elements when a magnetic field is applied, a difference signal is detectable proportionally to the magnetic field and/or a magnetic field change between two bridge arms of the bridge circuit.

14. The magnetic field sensor structure as claimed in claim 1, wherein the first and second magnetoresistive elements are connected in a Wheatstone measuring bridge circuit such that due to the different reference magnetization directions and associated different changes in resistance values of the first and second magnetoresistive elements when a magnetic field is applied, a difference signal is detectable proportionally to the magnetic field and/or a magnetic field change between two bridge arms of the bridge circuit.

15. A method of producing a magnetic field sensor structure, the method comprising:

arranging a first magnetoresistive element in a spin-valve arrangement with a first reference layer structure with a layer thickness $D_{RL,1}$ and a first ferromagnetic layer structure with a layer thickness $D_{PL,1}$, wherein the first ferromagnetic layer structure is antiferromagnetically coupled to the first reference layer structure, wherein arranging the first magnetoresistive element comprises forming a third ferromagnetic layer structure above or below the first reference layer structure with a barrier layer structure therebetween, wherein the barrier layer structure is formed to magnetically decouple or to weakly couple the third ferromagnetic layer structure and the first reference layer;

arranging a second magnetoresistive element, vertically above the first magnetoresistive element and galvanically isolated therefrom, in a spin-valve arrangement with a second reference layer structure with a layer thickness $D_{RL,2}$ and a second ferromagnetic layer structure with a layer thickness $D_{PL,2}$, wherein the second ferromagnetic layer structure is antiferromagnetically coupled to the second reference layer structure, wherein arranging the second magnetoresistive element comprising forming a fourth ferromagnetic layer structure on or below the second reference layer structure with a second barrier layer structure therebetween, wherein the second barrier layer structure is formed to magnetically decouple or to weakly couple the fourth ferromagnetic layer structure and the second reference layer structure;

wherein a first layer thickness ratio of the layer thickness $D_{PL,1}$ to the layer thickness $D_{RL,1}$ is greater than 1, and a layer thickness ratio of the layer thickness $D_{PL,2}$ to the layer thickness $D_{RL,2}$ is smaller than 1; and exposing the first magnetoresistive element and the second magnetoresistive element to a magnetization field with an advantageous magnetization direction during a magnetization write-in process in order to achieve different reference magnetization directions in the first and second reference layer structures due to the different layer thickness ratios.

16. The method as claimed in claim 15, wherein exposing comprises achieving opposed reference magnetization directions in the first and second reference layer structures.

17. The method as claimed in claim 15, further comprising: adjusting the field strength of the magnetization field to a value of between 5 and 250 mT.

18. The method as claimed in claim 15, wherein the first and second magnetoresistive elements are arranged such that the first layer thickness ratio $D_{PL,1}/D_{RL,1}$ is inverse to the second layer thickness ratio $D_{PL,2}/D_{RL,2}$.

19. The method as claimed in claim 15, wherein the first magnetoresistive element is arranged such that the layer thickness $D_{RL,1}$ of the first reference layer structure deviates by no more than 75% of the layer thickness of the first reference layer structure from a layer thickness $D_{PL,1}$ of the first ferromagnetic layer structure.

20. The method as claimed in claim 15, wherein the second magnetoresistive element is arranged such that the layer thickness $D_{RL,2}$ of the second reference layer structure deviates by no more than 75% of the layer thickness of the second reference layer structure from a layer thickness $D_{PL,2}$ of the second ferromagnetic layer structure.

21. The method as claimed in claim 15, wherein the first and/or the second magnetoresistive element(s) is/are implemented as GMR spin-valve elements (GMR=giant magnetoresistance).

22. The method as claimed in claim 15, wherein the first and/or the second magnetoresistive element(s) is/are implemented as TMR spin-valve elements (TMR=tunneling magnetoresistance).

23. The method as claimed in claim 15, wherein the magnetic field sensor structure is manufactured as an integrated component in a CMOS semiconductor processing method.

24. A magnetic field sensor structure comprising:

a first magnetoresistive element in a spin-valve arrangement with a first reference layer structure with a first reference magnetization direction and with a first ferromagnetic layer structure antiferromagnetically coupled to the first reference layer structure, wherein a first layer thickness ratio DPL,1/DRL,1 of a thickness DPL,1 of the first ferromagnetic layer structure to a thickness DRL,1 of the first reference layer structure is greater than 1, the first magnetoresistive element further comprising a third ferromagnetic layer structure; and a second magnetoresistive element in a spin-valve arrangement with a second reference layer structure with a second reference magnetization direction and with a second ferromagnetic layer structure antiferromagnetically coupled to the second reference layer structure, wherein a second layer thickness ratio DPL,2/DRL,2 of a thickness DPL,2 of the second ferromagnetic layer structure to a thickness DRL,2 of the second reference layer structure is smaller than 1, the second magnetoresistive element further comprising a fourth ferromagnetic layer structure, wherein the first and second magnetoresistive elements are arranged in a layer stack vertically above each other and galvanically isolated from each other by an intermediate layer, and wherein the first and second reference magnetization directions are different, wherein the third ferromagnetic layer structure has a large lateral geometrical aspect ratio resulting in a magnetization direction of the third ferromagnetic layer structure which is perpendicular or approximately perpendicular to the reference magnetization direction of the first reference layer structure, and wherein the fourth ferromagnetic layer structure has a large lateral geometrical aspect ratio resulting in a magnetization direction of the fourth ferromagnetic layer structure which is perpendicular or approximately perpendicular to the reference magnetization direction of the second reference layer structure.

25. The magnetic field sensor structure as claimed in claim 24, wherein the first and second reference magnetization directions are opposed to each other.

26. The magnetic field sensor structure as claimed in claim 24, wherein the first layer thickness ratio $D_{PL,1}/D_{RL,1}$ is inverse to the second layer thickness ratio $D_{PL,2}/D_{RL,2}$.

27. The magnetic field sensor structure as claimed in claim 24, wherein a layer thickness $D_{RL,1}$ of the first reference layer structure deviates by no more than 75% of the layer thickness of the first reference layer structure from a layer thickness $D_{PL,1}$ of the first ferromagnetic layer structure.

28. The magnetic field sensor structure as claimed in claim 24, wherein a layer thickness $D_{RL,2}$ of the second reference layer structure deviates by no more than 75% of the layer thickness of the second reference layer structure from a layer thickness $D_{PL,2}$ of the second ferromagnetic layer structure.

29. The magnetic field sensor structure as claimed in claim 24, wherein the first reference layer structure is a topmost or bottommost ferromagnetic layer structure of a layer structure stack of an odd-numbered layer structures antiferromagnetically coupled to one another, and wherein the second reference layer structure is a topmost or bottommost ferromagnetic layer structure of a layer structure stack of an even-numbered layer structures antiferromagnetically coupled to one another.

30. The magnetic field sensor structure as claimed in claim 24, wherein the first and/or the second magnetoresistive element(s) is/are implemented as a GMR spin-valve element (GMR=giant magnetoresistance).

31. The magnetic field sensor structure as claimed in claim 24, wherein the first and/or the second magnetoresistive element(s) is/are implemented as a TMR spin-valve element (TMR=tunneling magnetoresistance).

32. The magnetic field sensor structure as claimed in claim 24, wherein the first and second reference magnetization directions are anti-parallel, and wherein changes in resistance values of the first and second magnetoresistive elements thus are opposed to each other.

* * * * *

UNITED STATES PATENT AND TRADEMARK OFFICE
CERTIFICATE OF CORRECTION

| | |
|---|---|
| PATENT NO. | : 8,063,633 B2 |
| APPLICATION NO. | : 12/171185 |
| DATED | : November 22, 2011 |
| INVENTOR(S) | : Raberg et al. |

Page 1 of 1

It is certified that error appears in the above-identified patent and that said Letters Patent is hereby corrected as shown below:

In Col. 23, line 14, claim 13, delete "two".

Signed and Sealed this
Fifteenth Day of May, 2012

David J. Kappos
*Director of the United States Patent and Trademark Office*